United States Patent
Hasegawa et al.

[11] Patent Number: 6,019,612
[45] Date of Patent: *Feb. 1, 2000

[54] ELECTRICAL CONNECTING APPARATUS FOR ELECTRICALLY CONNECTING A DEVICE TO BE TESTED

[75] Inventors: Yoshiei Hasegawa, Kanagawa-ken; Eichi Osato, Aomori-ken, both of Japan

[73] Assignee: Kabushiki Kaisha Nihon Micronics, Tokyo, Japan

[ * ] Notice: This patent is subject to a terminal disclaimer.

[21] Appl. No.: 09/115,573

[22] Filed: Jul. 14, 1998

Related U.S. Application Data

[63] Continuation-in-part of application No. 08/977,182, Nov. 24, 1997, Pat. No. 5,888,075.

[30] Foreign Application Priority Data

Feb. 10, 1997 [JP] Japan ........................................ 9-39734
May 15, 1997 [JP] Japan ..................................... 9-139100

[51] Int. Cl.[7] .................................................... H01K 9/09
[52] U.S. Cl. .............................. 439/73; 439/72; 324/755; 324/765
[58] Field of Search .................................. 439/70, 72, 73, 439/71; 324/754, 755, 765

[56] References Cited

U.S. PATENT DOCUMENTS

| | | |
|---|---|---|
| 4,295,700 | 10/1981 | Sado . |
| 4,402,562 | 9/1983 | Sado . |
| 4,445,735 | 5/1984 | Bonnefoy . |
| 4,506,938 | 3/1985 | Madden . |
| 5,069,629 | 12/1991 | Johnson . |
| 5,076,798 | 12/1991 | Uratsuji .................................. 439/269 |
| 5,207,584 | 5/1993 | Johnson . |
| 5,254,824 | 10/1993 | Johnson . |
| 5,273,442 | 12/1993 | Laub .......................................... 439/73 |
| 5,312,267 | 5/1994 | Matsuoka et al. ...................... 439/331 |
| 5,336,094 | 8/1994 | Johnson . |
| 5,360,348 | 11/1994 | Johnson . |
| 5,388,996 | 2/1995 | Johnson ...................................... 439/65 |
| 5,562,473 | 10/1996 | Ikeya et al. .............................. 439/331 |
| 5,572,407 | 11/1996 | Sobhani ................................... 361/719 |
| 5,594,355 | 1/1997 | Ludwig .................................... 324/755 |
| 5,841,640 | 11/1998 | Shibata .................................... 361/820 |

FOREIGN PATENT DOCUMENTS

| | | |
|---|---|---|
| 5-299483 | 11/1993 | Japan . |
| 6-208876 | 7/1994 | Japan . |
| 07229949 | 8/1995 | Japan . |

*Primary Examiner*—Ren Yan
*Assistant Examiner*—Dave A. Ghatt
*Attorney, Agent, or Firm*—Christensen, O'Connor, Johnson & Kindness pllc

[57] ABSTRACT

The connecting apparatus has a plurality of probes, each having a deformed portion, a needle front portion with a tip end to be pressed against an electrode portion of a device to be tested and continuous with the deformed portion, and a needle tail portion continuous with the other end portion of the deformed portion, assembled in parallel into a base plate by assembling equipment with the tail end portions brought into contact with a retraction preventive portion. Thereby, when device to be tested is pressed against the probe, the probe is prevented from retracting according to the curved state of the deformed portion.

13 Claims, 18 Drawing Sheets

ELECTRICAL CONNECTING APPARATUS FOR ELECTRICALLY CONNECTING A DEVICE TO BE TESTED

STATEMENT OF RELATED APPLICATIONS

This application is a continuation-in-part of Ser. No. 08/977,182 which was filed Nov. 24, 1997, now U.S. Pat. No. 5,888,075, which in turn claims priority under 35 U.S.C. § 119 from Japan 9-39374 filed Feb. 10, 1997, and Japan 9-139100 filed May 15, 1997.

FIELD OF THE INVENTION

The present invention relates to an electrical connecting apparatus for use in testing a plate-like testing device such as an integrated circuit and a liquid crystal display panel.

BACKGROUND OF THE INVENTION

Generally, an inspection or a test of electrical characteristic of a packaged or molded semiconductor device, more particularly, an integrated circuit (IC), is generally performed by utilizing an electrical connecting apparatus such as a test socket, i.e., an inspection socket, to which a semiconductor device is removably attached, as an auxiliary apparatus for testing.

There is provided a connecting apparatus of such a type using a crank-shaped contact, i.e., a probe wherein a needle front portion to be in contact with a lead (electrode portion) of a semiconductor device and a needle tail portion to be connected to a conductive portion of a base plate is bent in the opposite directions (Japanese Patent Appln. Public Disclosure No. 7-229949).

In this conventional connecting apparatus, each probe is attached to a common needle presser by an adhesive in the intermediate portion between the needle front portion and the needle tail portion such that the needle front portion extends upward and the needle tail portion extends downward.

In this conventional auxiliary apparatus, however, an assembling work such as attaching a probe to the needle presser or soldering the needle tail portion to the conductive portion of the base plate requires skill, and since the length dimension of an effective area (from the needle tip to a contact point to the conductive portion) is great, there is a limitation in raising the frequency of an electric signal used for testing.

There is another connecting apparatus which uses a plate-like probe formed in a Z-like shape or an annular shape (U.S. Pat. No. 5,336,094 and U.S. Pat. No. 5,388,996). In this conventional connecting apparatus, however, since each probe is pressed against an electrode portion of a device to be tested at its arc-shaped deformed face portion, no scraping action due to a displacement of the deformed face portion relative to the electrode portion occurs, so that a film such as an oxide film existing in the electrode portion is not effectively eliminated. Consequently, a favorable electric contact between the probe and the electrode portion cannot be obtained.

There is a connecting apparatus for testing an electrical characteristic of a non-packaged or non-molded semiconductor device, particularly an IC chip, which uses a probe bent in a C-like shape (Japanese Patent Appln. Public Disclosure No. 5-299483). According to this conventional connecting apparatus, however, since each probe is only held in a socket by its own spring force, and since both ends of the C-like shape must be further curved, the probe becomes complicated in shape and expensive.

Accordingly, in an electric connecting apparatus for testing a device, it is important to simplify the shape of a probe, to enhance the stability of the probe, to make it adapted to a high frequency test, and to facilitate manufacturing the same, while giving an effective scraping action to the electrode portion of the device to be tested by being surely elastically deformed without retraction of the probe when the tip end of the probe is pressed against the electrode portion of the device to be tested.

SUMMARY OF THE INVENTION

The connecting apparatus relative to the present invention comprises a plurality of probes for electrically connecting an electrode portion of a device to be tested and a conductive portion of a base plate, and an assembling equipment for assembling the probes in parallel into the base plate. Each probe includes a deformed portion, a needle front portion continuous with one end of a deformed portion and having a needle tip to be pressed against an electrode portion of the device, and a needle tail portion continuous with the other end of the deformed portion. The assembling equipment has a retraction preventive portion for preventing the probe from retracting and an elastically deformable needle presser in contact with the deformed portion or the needle tail portion. The probe is in contact with the retraction preventive portion at the tail end portion.

Though having the deformed portion, the probe is simple in shape in comparison with the conventional C-shaped probe and costs less. The probe is disposed between the base plate and the needle presser at least at a part of the deformed portion or the needle tail portion to be in contact with the conductive portion and the needle presser portion at least at a part of the deformed portion of the needle tail portion, so that the probe is stabilized and an assembling work of the connecting apparatus becomes easy.

Each probe is pressed against the electrode portion of the device to be tested at the tip end of the needle point portion. Thereby, each probe is subjected to overdrive but does not retract because the tail end portion of each probe is in contact with the retraction preventive portion.

Consequently, each probe is surely elastically deformed at a region from the portion in contact with the conductive portions to the needle tip side, or each probe makes the needle presser portion surely elastically deform, so that the tip end of the probe is displaced relative to the electrode portion. As a result, a part of the film such as an oxide film existing in the electrode portion is scraped (or scratched away) by the tip end of the needle front portion, and the probe and the electrode portion are maintained in a favorable electrically connected state. The probe has a deformed portion, but the shape is simple in comparison with the conventional C-shaped probes and costs less.

An effective area is from a portion in contact with the conductive portion to the needle front side, so that the probe has a smaller effective area than the conventional probes, to reduce a leakage of an electric signal between adjacent probes, and is suitable for a high frequency test.

As mentioned above, according to the present invention, even if the probe is subjected to an overdrive action, the probe itself is surely elastically deformed or deforms the needle presser under compression by the needle tail portion without retracting, whereby the tip end of the probe gives a scraping action effectively and a favorable state of electrical connection is maintained between the probe and the electrode portion. Also, in comparison with a C-shaped one, the probe is simple in shape and costs less. Further, the effective area of the probe becomes smaller to be suitable for a high frequency test. Still further, the probe is maintained stable, and the manufacture of the connecting apparatus is facilitated.

The probe can include an outside region extending in an arc-like shape and to be brought into contact with the conductive portion when at least the electrode portion is pressed by the needle tip. Thereby, the greater becomes the pressing force by the device to be inspected, the contact portion of the outside region with the conductive portion changes toward the side of the needle tip.

The assembling equipment may include one or more covers and one or more needle pressers having a needle presser portion, the cover being assembled into the base plate and having a recess extending in the arranging direction of the probes as well as the retraction preventive portion, and opening at the side of the base plate. Thereby, since the needle presser does not displace relative to the cover, the probe becomes more stable, and an assembling work becomes easier.

The cover is further provided with a plurality of slots at intervals in the longitudinal direction of the needle presser, opening at the sides of the base plate and the device to be inspected and communicating with the recess, so that the needle front portion of each probe is passed through the slot to project the needle tip out of the slot. Thereby, since the position of the needle front portion in the arranging direction of the probes is regulated by the slot, the probe becomes more stable, and the assembling work becomes easier.

Instead of this, the cover may have a plurality of the slots opening at the side of the base plate and communicating with the recess and placed at intervals in the longitudinal direction of the needle presser. Part of the deformed portion of each probe can be disposed in the slot. Also by this, since the positions of the probes in the arranging direction of the probes are regulated by the slots, the probe becomes more stable, and the assembling work becomes easier.

The retraction preventive portion can include the inner face of the recess or the end face of the slot. In this case, the probe can include the rear end face in contact with the retraction preventive portion. However, the stopper disposed in the cover to form the retraction preventive portion may be provided in the assembling equipment.

In a preferred embodiment, the probe is curved in an arc-like shape at least at the deformed portion.

The accompanying drawings are included to provide a further understanding of the invention and are incorporated in and constitute a part of this specification, to illustrate the embodiments of the invention, and, together with the description, to explain the principles of the invention.

DETAILED DESCRIPTION OF THE PREFERRED EMBODIMENTS

Figure 1:
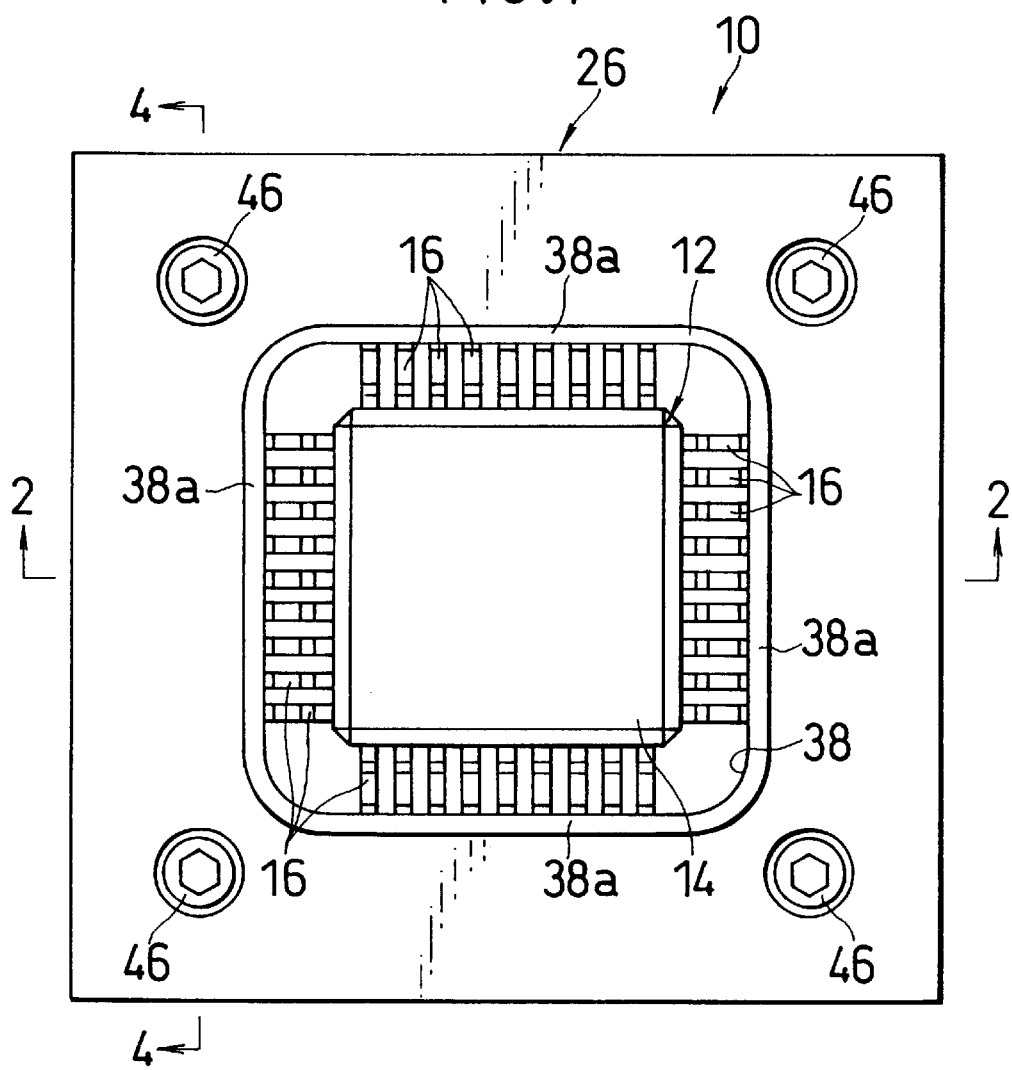
FIG. 1 is a plan view showing a first embodiment of a connecting apparatus the present invention.
Figure 2:
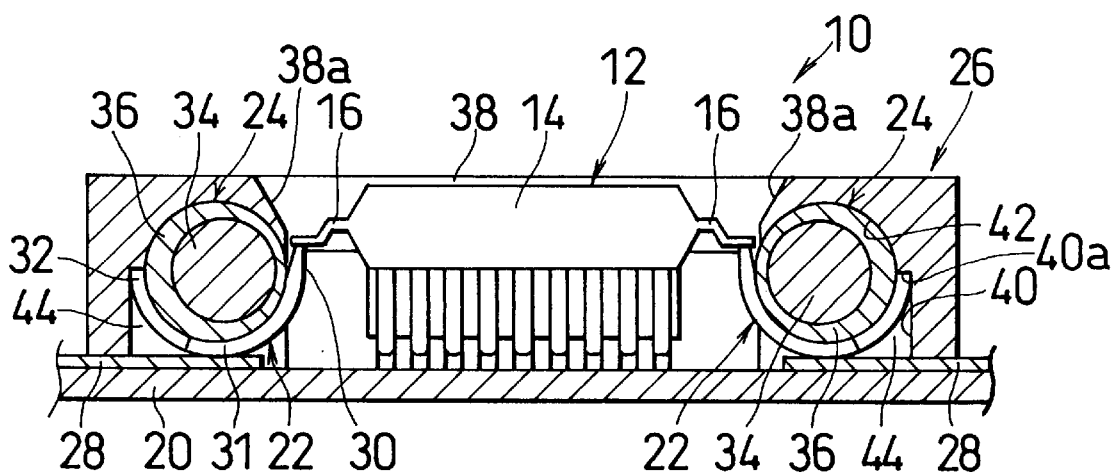
FIG. 2 is a cross-sectional view taken along the line 2—2 of FIG. 1.
Figure 3:
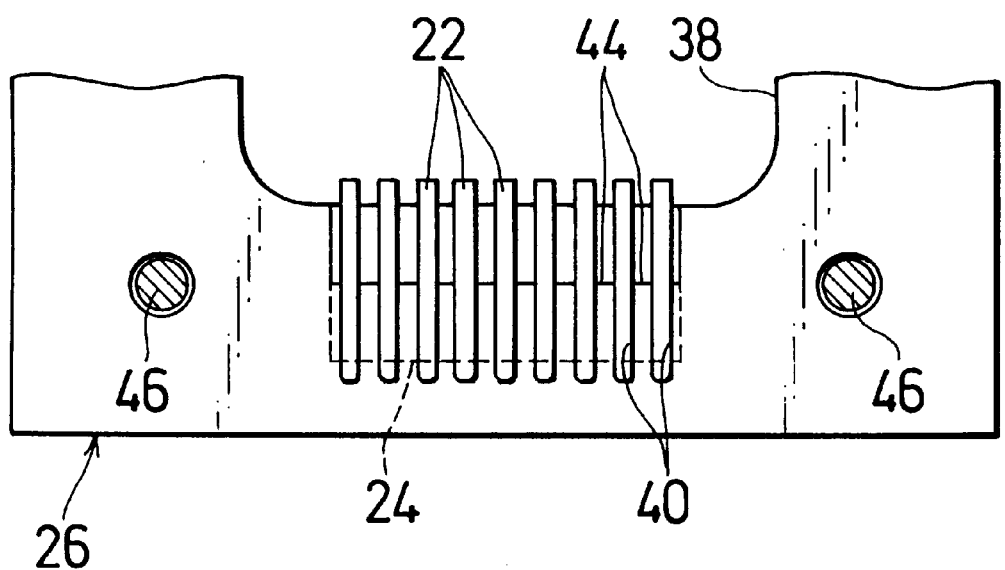
FIG. 3 is a bottom view of a part of the connecting apparatus shown in FIG. 1 with the base plate removed.
Figure 4:
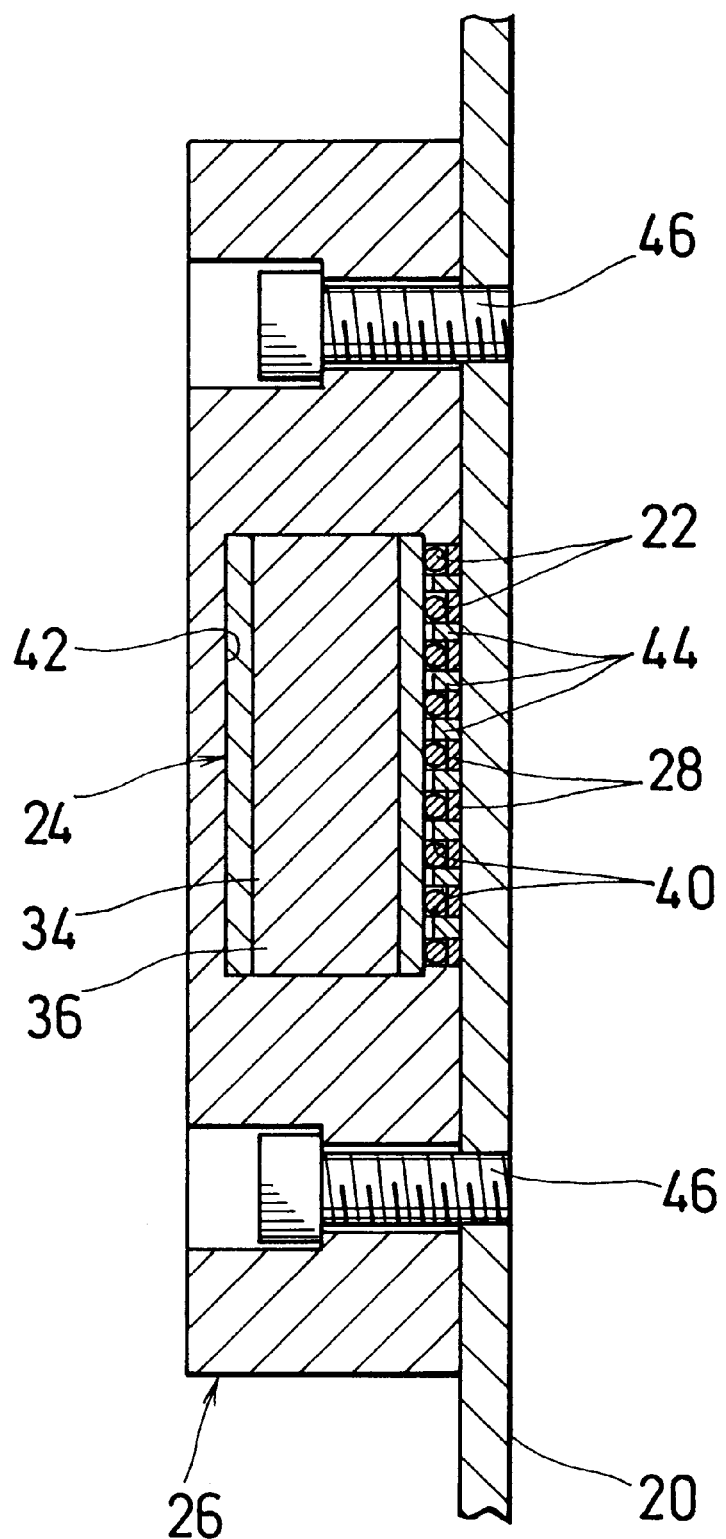
FIG. 4 is a cross-sectional view taken along the line 4—4 of FIG. 1.

Referring to FIGS. 1 to 6, a connecting apparatus 10 is used as an auxiliary apparatus for testing or inspecting a plate-like device 12 to be tested. In the illustrated embodiment, the device 12 is a semiconductor device such as a packaged or molded integrated circuit, but the present invention can also be applied to a connecting apparatus for testing another plate-like device such as a liquid crystal display panel.

The device 12 includes a base portion 14 packaged or molded in a rectangular flat shape, and a plurality of leads, i.e., electrode portions 16 projecting outward from a region corresponding to each side of the rectangle. The electrode portions 16 are divided into a plurality of electrode groups corresponding to each side of the rectangle, and the leads are juxtaposed in each electrode portion group.

The auxiliary apparatus, i.e., connecting apparatus 10 comprises a base plate 20, a plurality of contacts, i.e., probes 22, a plurality of needle pressers 24 for pressing the probes 22 against the base plate 20, and a plate-like cover 26 for assembling the needle pressers 24 into the base plate 20.

The base plate 20 is a printed wiring board with a wiring pattern formed on one surface of an insulated material by a print wiring technique, and has a plurality of belt-like printed conductive or wiring portions 28 respectively corresponding to the probes 22 on one surface. Each conductive portion 28 is a part of the wiring pattern. The conductive portions 28 are divided into a plurality of conductive portion groups corresponding to each side of the rectangle of the base portion 14 of the device 12, and the conductive portions are juxtaposed in each group.

Each probe 22 is formed, as shown in FIG. 7, in a shape of elastic non-conductive fine line and is curved like a semicircular arch over the whole area from a tapered needle front portion 30 to a needle tail portion 32 through an arc-shaped needle base portion, i.e., deformed portion 31.

Figure 7A:
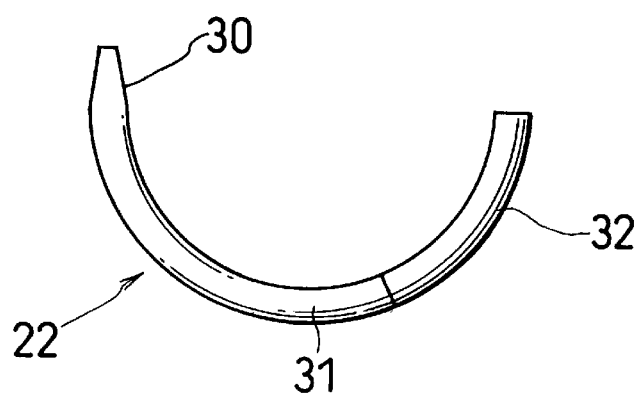
FIG. 7 are views showing the first embodiment of the probe used in the connecting apparatus shown in FIG. 1, in which (A) is a front elevation and (B) a left side view.
Figure 7B:
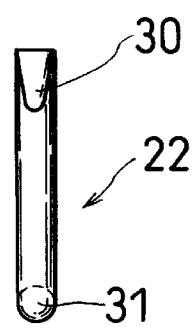

Each probe 22 has a conductive coat formed in portions other than the needle tail portion in the area shown by the reference numeral 32 in FIGS. 7A, 7B and 7C, that is, in the entire external surfaces of the needle front portion 30 and the curved portion, i.e., deformed portion 31. Thereby, the portion ahead of the portion in contact with the conductive portion 28 has conductivity, while the needle tail portion 32 has non-conductivity. Therefore, though acting as a conductive probe, there is no leakage of an electric signal for testing in the needle tail portion 32, particularly no leakage of an electric signal between adjacent probes.

However, each probe 22 may have a core formed of a conductive fine line, preferably in a shape of a metal fine line, with a non-conductive coat formed in the needle tail portion 32 in the core. The probe 22 may be formed of a fine line of metal, ceramic, synthetic resin or the like, and by a process such as press working, etching work, etc., using such a material.

Each probe 22 has a circular sectional shape in the examples shown in FIGS. 1 through 7. Further, the probe 22 is a so-called chisel-type needle with its needle tip, i.e., tip end extending at right angles to the curved face of the probe 22.

Figure 8A:
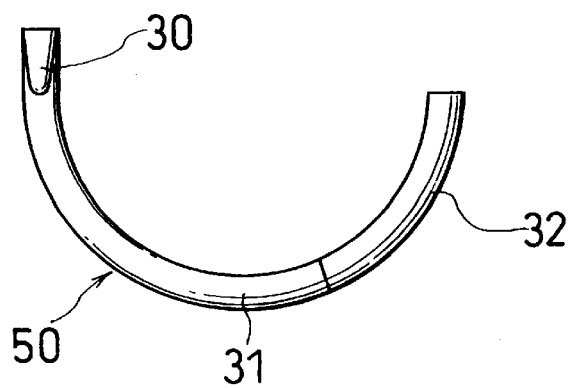
FIG. 8 are views showing a second embodiment of the probe used in the connecting apparatus shown in FIG. 1, in which (A) is a front elevation and (B) a left side view.
Figure 8B:
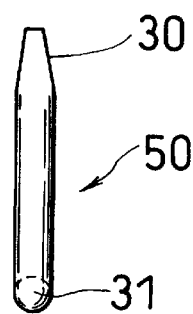

Each probe 22, however, like the probe 50 shown in FIG. 8, may be an ax-type needle with its tip end extending parallel to the curved face of the probe 22, or of a shape having a conical or pyramidal needle front portion. The sectional shape of the probe may be either circular or square.

The probes 22 are divided into a plurality of probe groups corresponding to each side of the rectangle of the base portion 14 of the device 12 to be inspected. In the illustrated embodiment, the device 12 has a plurality of electrode portions at each of the four sides of the rectangle, and the probes 22 are divided into four probe groups. For the same reason, in the illustrated embodiment, there are provided four needle pressers 24.

Each needle presser 24 is shaped to be cylindrical by a cylindrical presser bar 34 and an insulated elastic material layer 36 formed in the peripheral surface of the presser bar 34. The presser bar 34 can be a conductive or a non-conductive bar-like member. An insulated layer, i.e., the elastic material layer 36 may be a tube formed of a rubber material such as silicone rubber. The needle presser 24 may, however, be formed like a bar of a single member such as an elastically deformable rubber.

The cover 26 includes an opening 38 formed in the center so as to accommodate the device 12 to be inspected, a plurality of slots 40 formed outside the opening 38 so as to extend outwardly relative to the opening 38, and a plurality of recesses 42 formed outside the opening and extending in the arranging direction of the slots 40 continuously. Such a cover 26 can be formed of a non-conductive material.

The opening 38 has a rectangular shape analogous to the device 12 with their respective corner portions arc-shaped. The upper portion of the opening 38 is tapered downward by an inclined plane 38a directed from the outside toward the center side. Each corner portion of the opening 38 is an arc-shaped plane.

The slot 40 is a slot for accommodating at least the deformed portion 31 and the needle tail portion 32 of the probe 22. Accordingly, in the illustrated embodiment the same number of the slots as that of the probes 22 are provided. The slots 40 are divided into a plurality of slot groups corresponding to each side of the rectangle forming the opening 38, and the slots are juxtaposed in each group. Each slot 40 opens at the side of the base plate 20, that is, downward and at the opening 38.

Adjacent slots 40 are divided by partition walls 44. The partition walls 44 are provided, in the illustrated embodiment, so as to divide the rear half of the slot 40, and therefore, adjacent slots 40 are continuous at the portion of the opening 38. However, the partition walls 44 may be provided so as to divide the entire slots 40.

The recesses 42 correspond to each side of the rectangle forming the opening 38 and extend along the corresponding side. In the illustrated embodiment, four recesses 42 are provided. Each recess 42 is a semi-circular groove accommodating the needle presser 24 and opens at the slot bottom surface of the corresponding slot 40. The groove bottom surface of each recess 42 is upwardly convex in cross-section.

The connecting apparatus 10 can be assembled by disposing each needle presser 24 in the recess 42, each probe 22 in the slot 40 such that its rear end is in contact with the deep bottom surface (in the illustrated embodiment, the upper surface), overlapping in that state the probe 22, the needle presser 24 and the cover 26 on the base plate 20, and attaching the cover 26 to the base plate 20 with a plurality of screw members 46 such as bolts.

Each screw member 46 penetrates the cover in its thickness direction and is screwed into a screw hole formed in the base plate 20. As a result, the probe 22 is pressed against the conductive portion 28 of the base plate 20 at a part of the arc-shaped curved portion 31 by the needle presser 24 and maintained in a state of being sandwiched between the base plate 20 and the needle presser 24.

In the illustrated embodiment, the needle presser 24, the cover 26 and the screw member 46 act as an assembling equipment for assembling the probes 22 in parallel in the base plate 20. Also, since the lower half portion of each needle presser 24 projects in an arc-like shape from the recess 42 to the side of the base plate 20 and extends in the arranging direction of the probes 22, they act as a needle presser portion in contact with the inside of the curved portion of the probe 22 so as to press the probe 22 against the base plate 20.

By disposing the probes 22 in the slots 40 such that the needle front portions 30 project upward within the opening 38 and merely bringing the probes 22 into contact with the base plate 20 with the needle pressers 24, the probes 22 can be correctly juxtaposed in each probe group. Therefore, the fabrication of the connecting apparatus 10 is easy.

Since at least the needle tail portion 32 of the probe 22 is received in a portion divided by the partition wall 44 in the state of being assembled into the connecting apparatus 10 and pressed against the base plate 20 through the elastic material layer 36 made of an insulated material, the probe 22 is maintained in a more stable state by the slot 40 and the needle presser 24 to be surely prevented from being brought into electrical contact with the adjacent probe.

In an assembled state, each probe 22 is pressed against the conductive portion 28 at an arc-shaped outside face of the deformed portion 31 where no insulated layer 32 exists, so that the region of the base portion 31 of the arc-shaped needle acts as the deformed portion.

Figure 5:
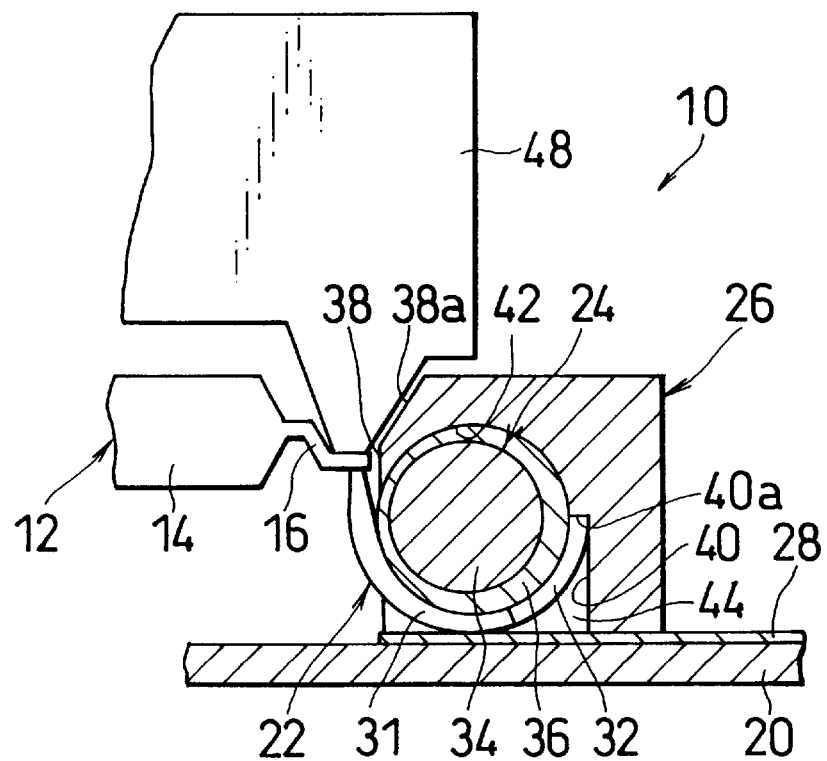
FIG. 5 is a cross-sectional view for explaining a state of a probe when a device to be inspected is disposed in the connecting apparatus.

Since each probe 22 is pressed against the conductive portion 28 at a region where no insulated layer 32 exists, the effective area of the probe 22 is from the portion of the probe 22 in contact with the conductive portion 28 to the needle tip, and is smaller than the conventional connecting apparatus. Also, as shown in FIG. 5, since the elastic material layer 36 is pressed against the base plate 20, the cover 26 and the presser bar 34 to be deformed, each probe 22 is firmly maintained. The presser bar 34 and the elastic material layer 36 may be previously made eccentric to each other or may be made eccentric to each other in the assembled state.

In inspecting, the device 12 is put in the opening 38 from above. At this time, if the position of the device 12 is deviated relative to the connecting apparatus 10, the device 12 is in contact with the inclined plane 38a and is guided by the inclined surface 38a to the center of the opening 38. Thereby, the device 12 is, as shown in FIG. 5, accommodated in the connecting apparatus 10 in a state that the electrode portion 16 is in contact with the needle tip of the probe 22.

Figure 6:
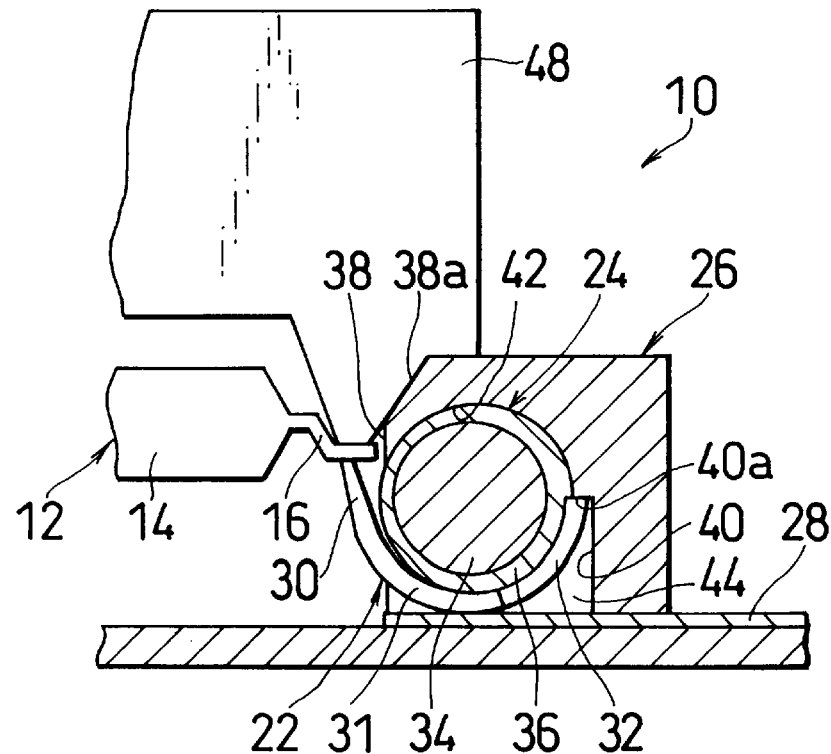
FIG. 6 is a cross-sectional view for explaining a state of a probe when a device to be inspected is pressed against the probe.

When the device 12 disposed in the connecting apparatus 10 is pressed down by a presser 48, each probe 22 is deformed under an overdrive action, as shown in FIG. 6. At this time, force to retract the probe along the arc-shaped outside face of the deformed portion 31 acts on the probe 22. The rear end of each probe 22 is, however, in direct contact with the end surface 40a of the slot 40, so that each probe 22 does not move (retract) in the circumferential direction of the needle presser 24.

However, when the probe 22 and the device 12 are pressed, each probe 22 is elastically deformed at a region from the portion in contact with the conductive portion 28 to the needle tip side so as to increase the radius of curvature without the probe 22 being retracted in the circumferential direction (curving direction of the deformed portion 31) of the needle presser 24 and so as to elastically deform the elastic material layer 36 to deform under compression.

Thereby, the needle tip of each probe 22 displaces relative to the electrode portion 16, causing a scraping action (or scratching action) to remove a part of the film existing in the surface of the electrode 16. Also, in each probe 22, a part of its tail end deforms the elastic material layer 36 to dent, thereby preventing the needle front portion 30 from falling in the axial direction of the needle presser 24.

As shown in FIG. 6, when the probe 22 is elastically deformed, the portion of the probe 22 in contact with the conductive portion 28 is changed toward the side of the needle tip. Also, since the elastic material layer 36 has been dented by the rear end of the probe, the rear end of the probe 22 tends to be apart from the inner face of the recess 40. However, the probe 22 is pushed back by restoring force of the needle presser 24 and slides slightly against the conductive portion 28.

Since this slide is a movement of the probe 22 to displace with its rear end face in contact with the inner face 40a (namely, not a movement of the probe 22 to retract along the periphery of the needle presser 24), an elastic deformation of the probe 22 so as to increase the radius of curvature is not affected by the slide such as the above. Therefore, the probe 22 is surely elastically deformed.

According to the connecting apparatus 10, as mentioned above, not only the probe is simple in shape and costs less but also the effective area of the probe 22 is small to suit a high frequency test, and though the probe is kept stable, it is easy to manufacture the connecting apparatus. Also, the device 12 is disposed in the connecting apparatus 10 in a natural and correct state, the electrode portion 16 of the device 12 is surely brought into contact with the needle tip, and besides, elastically deforming without retracting, gives a scraping action effectively to the electrode portion 16. Further, the structure of the needle presser 24 is simple, and an electric short-circuit between the probes 22 can be surely prevented.

Figure 9:
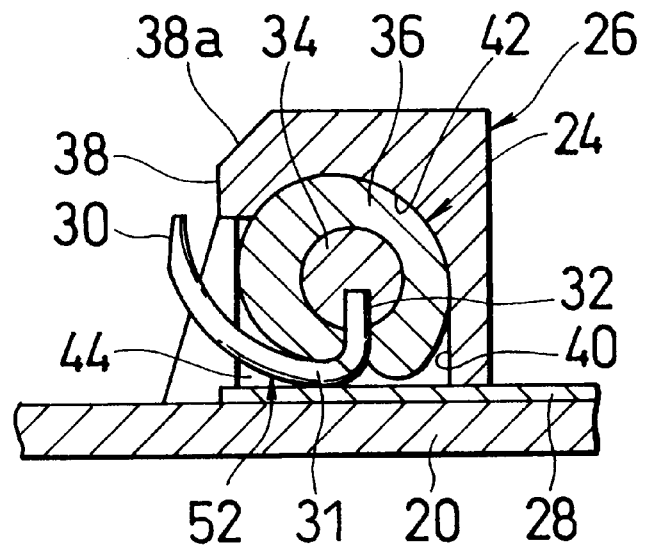
FIG. 9 is a cross-sectional view showing a part of the second embodiment of the connecting apparatus.

Referring to FIG. 9, a probe 52 is bent upward at the needle tail portion 32 having an insulated layer, bent upward in the needle tail portion 32 and forms a J-like shape to be inserted into the needle presser 24, and is pressed against the conductive portion 28 at the arc-shaped rear end portion of its deformed potion 31. According to this embodiment, too, since the needle tail portion 32 is prevented from moving relative to the needle presser 24, the region of the probe 52 in contact with the conductive portion changes toward the needle tip but does not move around the needle presser 24 in its circumferential direction.

Namely, when the probe 52 is pressed down by the device to be inspected, force to retract the probe 52 along the outside surface of the deformed portion 31 acts on the probe 52. However, since the rear end portion is inserted into the needle presser 24, the probe 52 is elastically deformed so as to increase the radius of curvature of the deformed portion 31, without retracting in the circumferential direction of the needle presser 24. As a result, even when the probe 52 is used, an action of effect similar to the case of using the probe 22 can be obtained.

Figure 10:
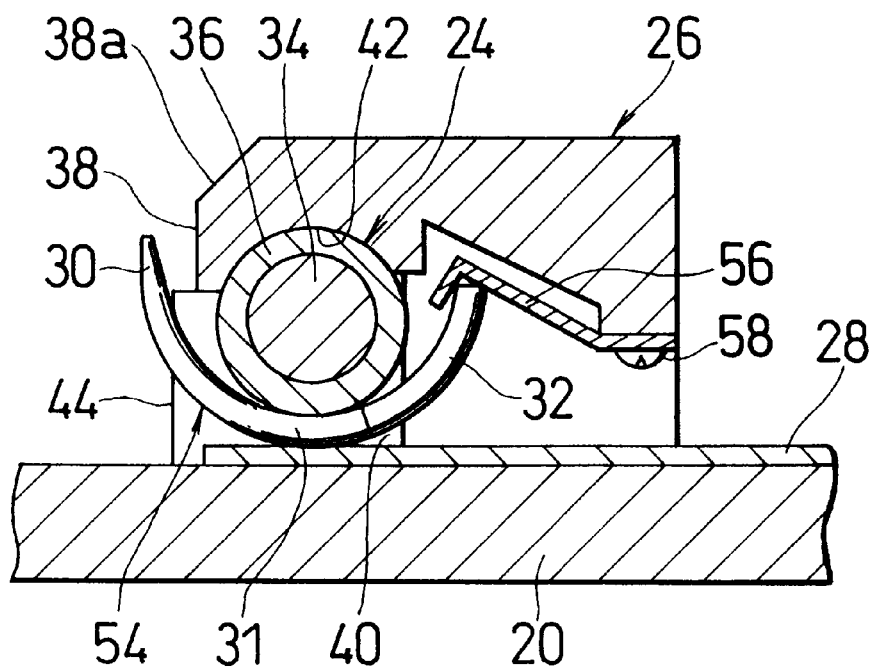
FIG. 10 is a cross-sectional view showing a part of a third embodiment of the connecting apparatus.

Referring to FIG. 10, a probe 54 has its tail end (particularly its tail end face) abut against a stopper 56 formed from a leaf spring for prevention of retraction. The stopper 56 is provided in each probe group and is attached to the cover 26 with a plurality of screw members 58. The stopper 56 can be formed of an insulated plate material but may be a conductive plate material having an insulated layer formed on its surface, and further, if the tail end of each probe is non-conductive, may be a conductive plate material.

Also according to the embodiment shown in FIG. 10, the probe 54, being prevented from moving backward relative to the needle presser 24 with its tail end abutting against the stopper 56, does not move around the needle presser 24 in its circumferential direction. For this reason, when the probe 54 is pressed down by the device to be inspected, the probe 54 is elastically deformed so as to increase the radius of curvature of the deformed portion 31. As a result, even when the probe 54 is used, an action and effect similar to the case of using the probe 22 can be obtained.

Figure 11:
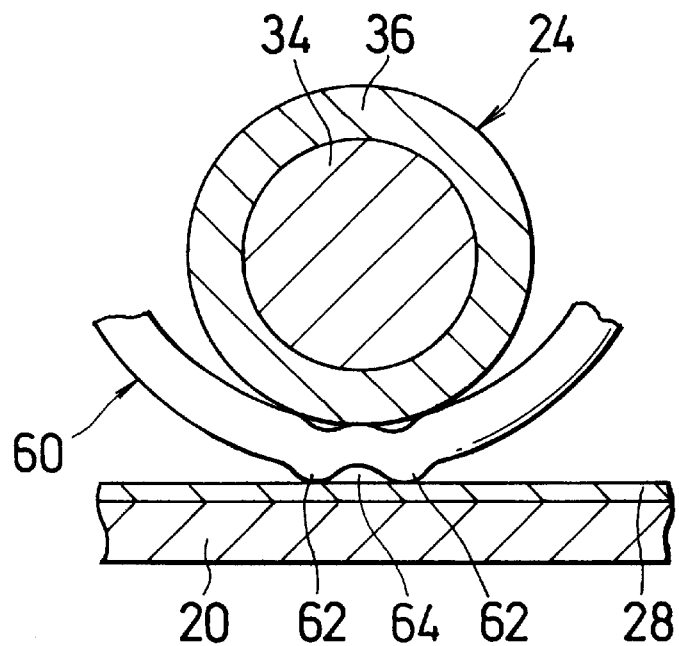
FIG. 11 is a view showing a part of a third embodiment of the probe used in the connecting apparatus shown in FIG. 1.

Referring to FIG. 11, a probe 60 has convex portions 62 and a concave portion 64 at the region in contact with the conductive portion 28. The probe 60 is pressed against the conductive portion 22 in the convex portions 62. As a result, in case of the probe 60, the region having the convex portions 62 acts as a deformed portion, i.e., an arc-shaped curved portion deformed in relation to the needle tail portion.

According to the probe 60, the convex portions 62 are engaged with the conductive portion 28, so that, due to the engagement of the convex portions 62 and the conductive portion 28, the movement of the probe 60 relative to the needle presser 24 makes the tail end of the probe 60 abut against the end face of the slot, the inner face of the recess or the stopper such as the above-mentioned probe, and is more surely prevented. As a result, the electrical connection between the conductive portion 28 and each probe 60 is more ensured.

In each of the embodiments mentioned above, it is possible to use a semi-cylindrical needle presser instead of the needle presser 24 making use of a part of the cylindrical portion as the convex portion, or to use a square pole-shaped member having a semi-cylindrical convex portion in one surface as a needle presser. Also, the needle presser may be a mere non-conductive bar-like member using no elastic material, so long as the needle presser has non-conductivity at least in its outer surface.

Figure 12:
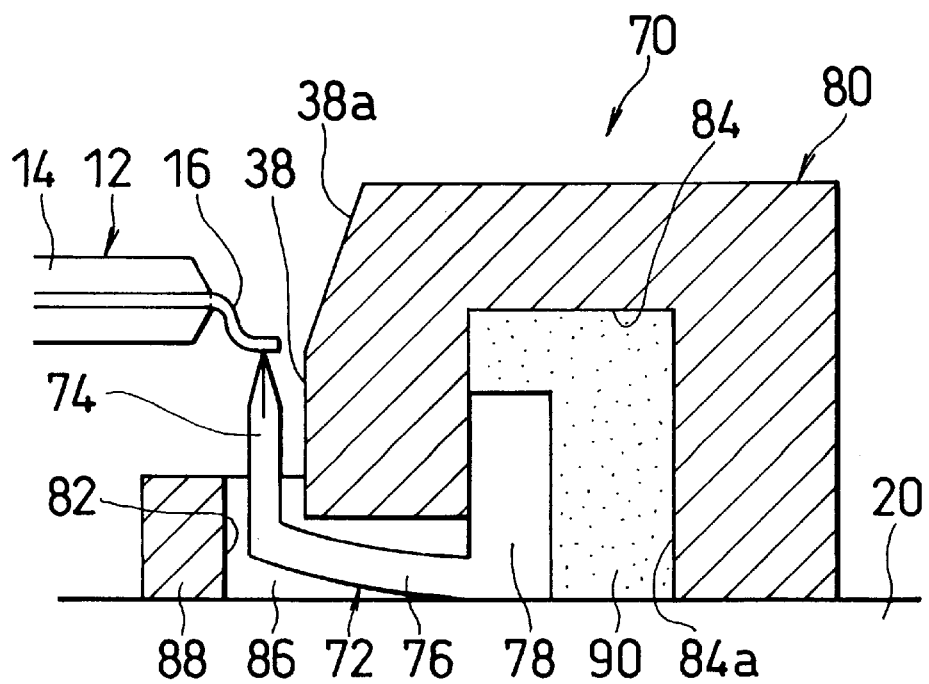
FIG. 12 is a cross-sectional view showing a part of a fourth embodiment of the connecting apparatus.

Referring to FIG. 12, an auxiliary apparatus 70 uses an approximately U-shaped probe 72. The probe 72 is formed to be approximately U-shaped by a needle front portion 74, a needle base portion, i.e., an arc-shaped deformed portion 76, and a needle tail portion 78. The needle front portion 74 and the needle tail portion 78 extend linearly upward respectively from the front end and the rear end of the deformed portion 76 approximately parallel to each other. The needle front portion 74 and the deformed portion 76 are made conductive at least in their outer peripheral surfaces.

The deformed portion 76 extends diagonally upward from the side of its rear end toward the side of the needle front portion 74 and curved in a convex form diagonally downward with a great radius of curvature. The needle tail portion 78 may be either conductive or non-conductive. The needle tail portion 78 has a larger sectional shape than the needle front portion and the deformed portion 76. The probe 72 has either a circular or a rectangular transverse sectional shape. For this reason, the probe 72 has a shape of either a fine line or a strip.

A cover 80 of the connecting apparatus 70 includes an opening 38 formed in the center to accommodate the device 12, a plurality of slots 82 extending from the opening 38 outwardly and in parallel, and a plurality of recesses 84 formed outside the opening 38 to extend continuously in the arranging direction of the slots 82. Such a cover 80 can be formed from a non-conductive material. The opening 38 is the same as the opening 38 of the cover 26 of the auxiliary apparatus 10. Therefore, the upper portion of the opening 38 is made to be an inclined surface 38a.

The slots 82 are grooves for accommodating a part of at least the deformed portion 76 of the probe 72, and accordingly, the number of the provided slots 82 is the same as that of the probes 72 in the illustrated embodiment. The slots 82 are divided into a plurality of slot groups to correspond to each side of the rectangle forming the opening 38, and are formed in parallel in each slot group. Each slot 82 opens at the side of the base plate 20, that is, downward and at the side of the opening 38 in the tip end upper portion.

Adjacent slots 82 are partitioned by a partition wall portion 86. The end of adjacent partition walls 86 at the side of the opening 38 are connected by a wall portion 88 closing the corresponding end portions of the slots 82. It is possible, however, not to connect the end portions at the side of the opening 38 of adjacent partition walls 86 but to open the corresponding end portions of the slots 82.

The recesses 84 correspond to each side of the rectangle forming the opening 38 and extend continuously along the corresponding sides. In the illustrated embodiment, actually four recesses 84 are provided. Each recess 84 is a groove having a rectangular sectional shape accommodating a needle presser 90 and opens at the sides of the rear end and the base plate 20 of the corresponding slot 82. Each recess 84 has a rectangular sectional shape.

Each needle presser 90 is formed in a rectangular sectional shape of an elastic material such as rubber and is fitted into the recess 84. In the illustrated embodiment, the needle presser 90 has a groove communicated with the slot 82 for receiving a part of the deformed portion 76 and the needle tail portion 78 of the probe 72. Such a groove may, however, be formed in the cover 80 or has to be formed neither in the cover 80 nor in the needle presser 90, depending on the shape and the dimension of the probe.

The connecting apparatus 70 can be assembled by arranging each needle presser 90 in the recess 84, arranging each probe 72 such that the deformed portion 76 of the probe 72 comes in the slot 82 and that the needle tail portion 78 comes in the recess 84, overlapping the probe 72, the needle presser 90 and the cover 80 on the base plate 20 in that state, and mounting the cover 80 on the base plate 20 with a plurality of screw members such as bolts in that state.

In the state of being assembled into the connecting apparatus 70, each probe 72 is pressed against the wiring portion of the base plate 20 at the rear end portion of the deformed portion 76 by the needle presser 90. Also, the needle tip of each probe 72 projects upward from the slot 82 into the opening 38, the needle tail portion 78 of each probe 72 is pressed against the inner wall surface forming the slot 82 by the needle presser 90, and the rear end face of each probe 72 is received by the needle presser 90. As a result, each probe 72 is pressed against the base plate 20 at the rear end side of the deformed portion 76.

When the needle tip of the needle front portion 74 is pressed against the electrode portion 16 of the device 12, the probe 72 itself is elastically deformed and deforms the needle presser 90 so that the needle front portion 74 and the needle tail portion 78 may spread. Thereby, the probe 72, giving at its needle tip a scraping action to the electrode portion 16, removes a part of a film such as an oxide film existing in the surface of the electrode 16.

The force directed to retract the probe 72 is the force directed to displace the probe 72 along the arc-shaped outside face of the deformed portion 76, but the probe 72 is prevented from retracting because its tail end face is indirectly in contact with the inner face 84a of the recess 84 through the needle presser 90. However, the probe 72 may be pressed against the base plate 20 by the needle presser 90, by making the rear end face of the probe 72 indirectly contact with the inner face 84a of the recess 84 by the needle presser 90.

The connecting apparatus 70 not only gives an action and effect similarly to the connecting apparatus 10 but also presses the needle tail portion 78 against the inner face of the recess 84 by the needle presser 90, so that the probe 72 is more stabilized.

Figure 13:
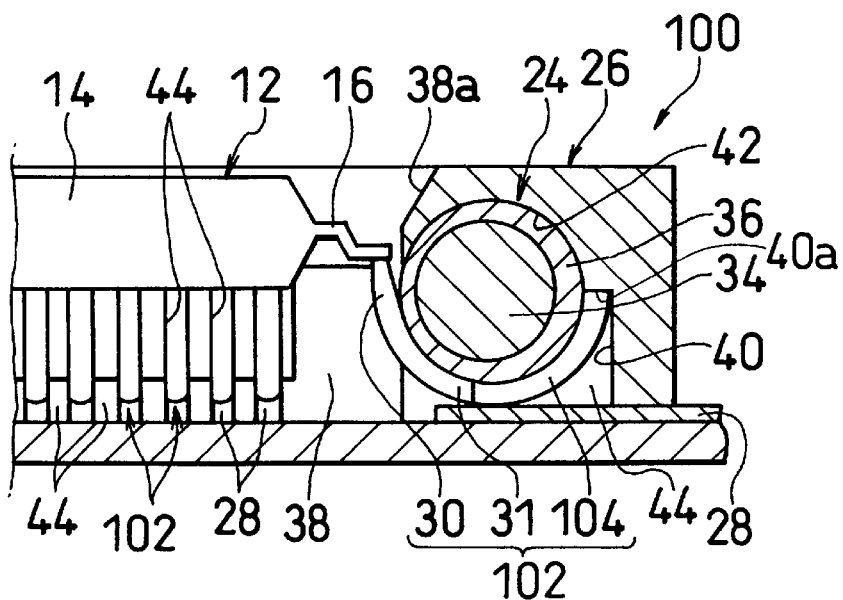
FIG. 13 is a cross-sectional view showing a part of a fifth embodiment of the connecting apparatus.
Figure 14A:
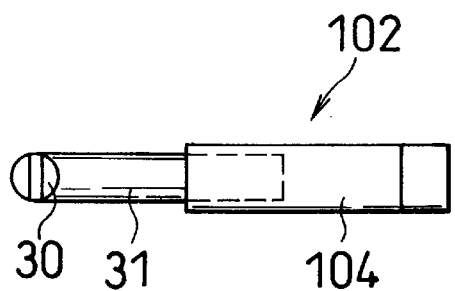
FIG. 14 are views showing an embodiment of the probe used in the connecting apparatus shown in FIG. 13, in which (A) is a plan view, (B) a front elevation, and (C) a right side view.
Figure 14B:
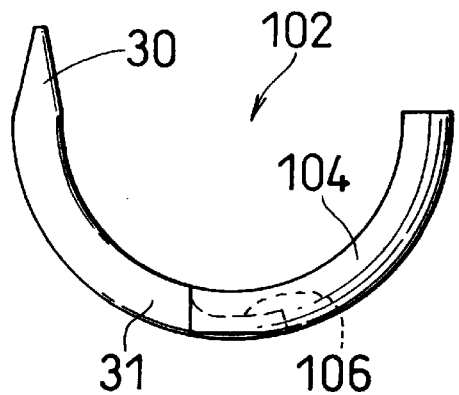
Figure 14C:
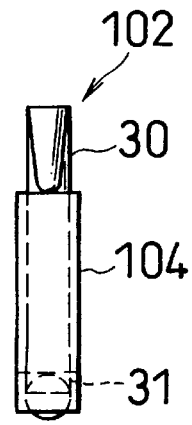

Referring to FIG. 13, a connecting apparatus 100 uses in the connecting apparatus 10 shown in FIGS. 1 through 6 a plurality of probes 102 having such a shape as shown in FIG. 14 instead of using probes extending integrally from the tip end to the rear end as in the auxiliary apparatus 10.

Each probe 102 is composed of a needle front portion 30, a deformed portion 31 and a needle tail portion 104 combined with the rear end of the deformed portion 31, and is curved in an arc-like shape at the same curvature over the entire area from the front end to the rear end. The needle tail portion 104 is formed of an insulated resin material such as synthetic resin material.

The tip end portion of the needle front portion 30 of each probe 102 is a tapered portion getting thinner toward the needle tip, and the portion backward from its needle tip is a bar-like portion having a circular sectional shape. The rear end portion of the deformed portion 31 of each probe 102 has a cutout 106 at the upper side for enhancing the force in combining with the needle tail portion 104.

The inside of the rear end of the deformed portion 31 of each probe 102 is covered with the needle tail portion 104, while the outside portion is exposed without being covered with the needle tail portion 104. Such a probe 102 can be fabricated by using an insulated material such as synthetic resin for the needle tail portion 104. The end face of the probe 102 is in direct contact with the deep bottom face, i.e., the end face 40a of the slot 40.

The connecting apparatus 100 using a plurality of probes 102 can be, as shown in FIG. 13, assembled similarly to the connecting apparatus 10 except that the deformed portion 31 of each probe 102 is pressed against the wiring portion 28 outside the portion combined with the needle tail portion 104, acts similarly to the connecting apparatus 10 and gives a similar effect as the connecting apparatus 10.

Figure 15A:
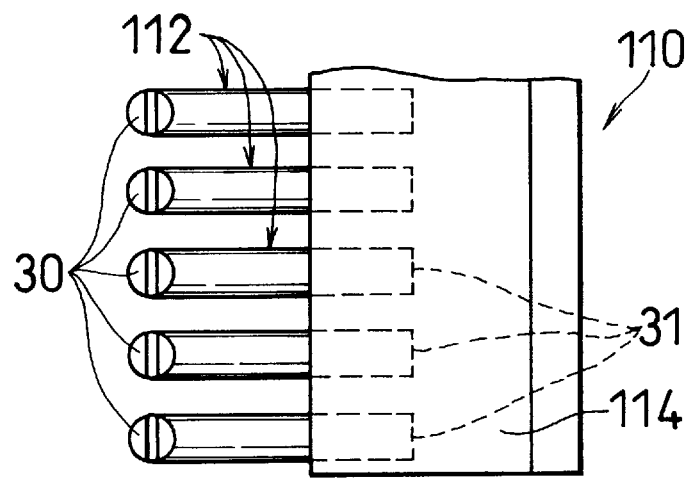
FIG. 15 are views showing another embodiment of the probe used in the connecting apparatus shown in FIG. 13, in which (A) is a plan view, (B) a front elevation, and (C) a right side view.
Figure 15B:
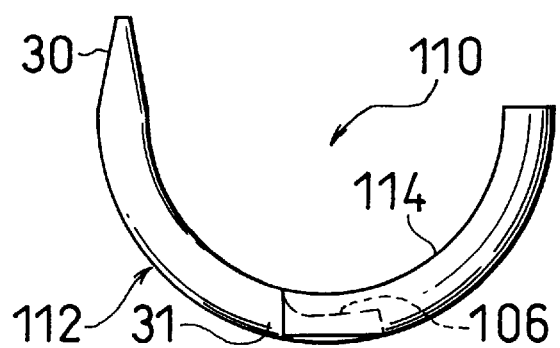
Figure 15C:
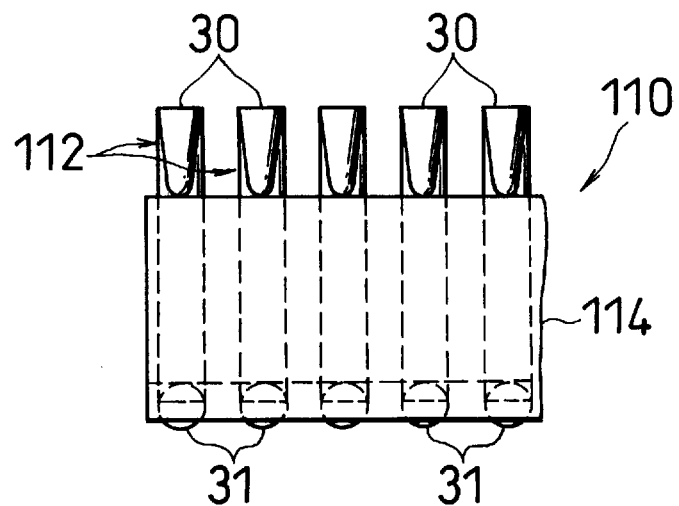

In the connecting apparatus 10 or 100, instead of using a plurality of independent probes 112, one or more needle assemblies 110 with a plurality of probes combined at the needle tail portions can be used, as shown in FIG. 15.

Each probe 112 used in the needle assembly 110 is formed similarly to the probe 102 shown in FIG. 14 except that it is combined with the needle tail portion 114 common to the plurality of probes 112 in the rear end of the deformed portion 31.

Therefore, the needle front portion 30 and the deformed portion 31 of each probe 112 are the same as those of the probe 102 shown in FIG. 14, and the deformed portion 31 of each probe 112 has a cutout portion 106 at its upper side for enhancing the combining force with the common needle tail portion 114. The common needle tail portion 114 has an elongate shape curved like a shallow chute made of a non-conductive material, with the same curvature as the needle front portions 30 and the deformed portions 31 of the probes 112.

The common needle tail portion 114 may be made common in each probe group of each side of the rectangle formed by the opening 38 of the aforementioned cover 26, or may be made common to every two or more probes. Also, since adjacent probes 112 are connected to the common needle tail portion 114 in the deformed portions 31, the cover 26 of the connecting apparatus using the probe assembly 110 includes neither the slot 40 nor the partition wall 44. It may, however, include a slot for receiving only the needle front portion 30 and the deformed portion 31 of each probe 112.

Therefore, the slot 40 is a continuous common slot. It is, however, possible to separate the portion receiving only the needle tip portion 30 and the deformed portion 31 of each probe 112 from the common slot 40 by the partition wall.

While the inside of the rear end portion of each deformed portion 31 is covered with the common needle tail portion 114, the outside thereof is not covered with the common needle tail portion 114 but is exposed. The needle assembly 110 can also be manufactured by fabrication using an insulated material such as synthetic resin as the common needle tail portion 114.

The connecting apparatus for testing using the needle assembly 110 can be assembled and utilized similarly to the connecting apparatus 10 and 70 and, besides bringing about actions and effects similarly to the connecting apparatus 10, the needle tail portions of the probes 112 are combined in common, so that there is such a merit as manufacturing and assembling of the needle assembly 110 are facilitated.

Figure 16:
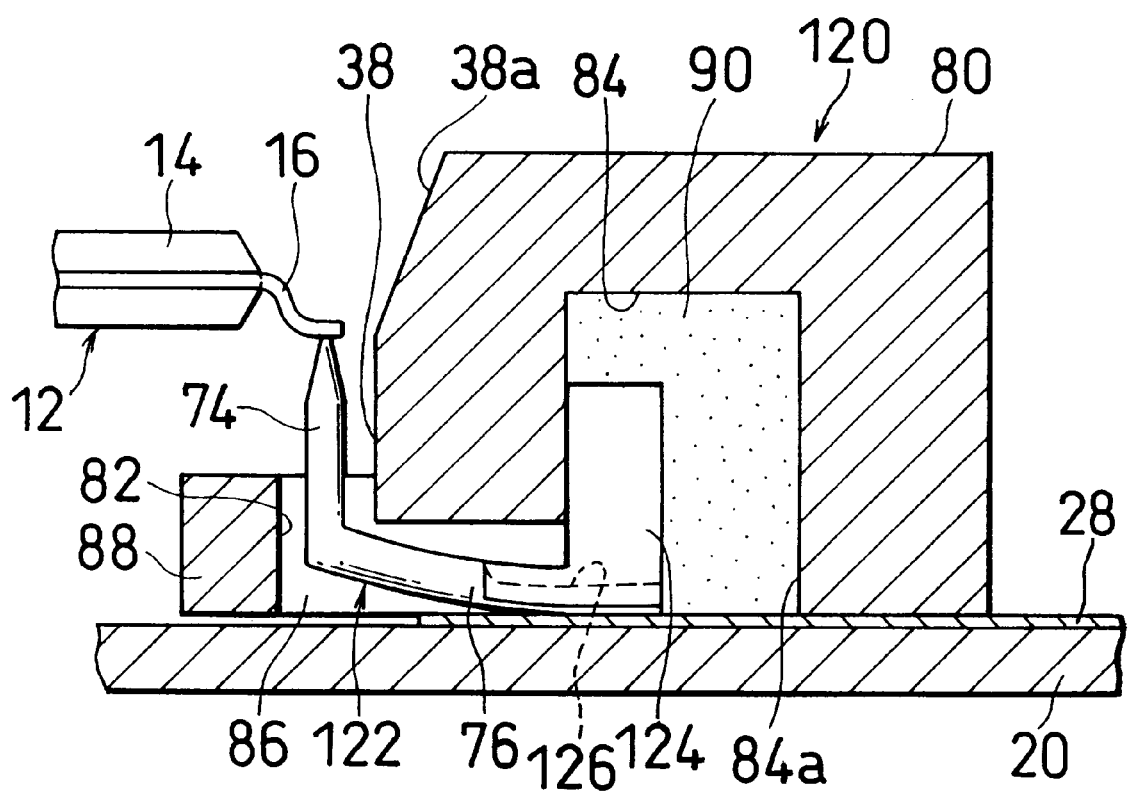
FIG. 16 is a cross-sectional view showing a part of a sixth embodiment of the connecting apparatus.
Figure 17A:
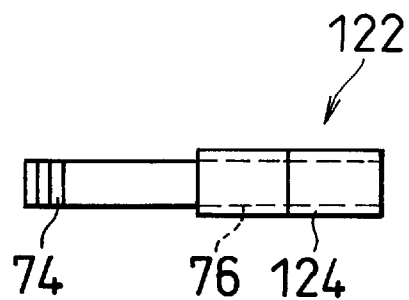
FIG. 17 are views showing an embodiment of the probe used in the connecting apparatus shown in FIG. 16, in which (A) is a plan view, (B) a front elevation, and (C) a right side view.
Figure 17B:
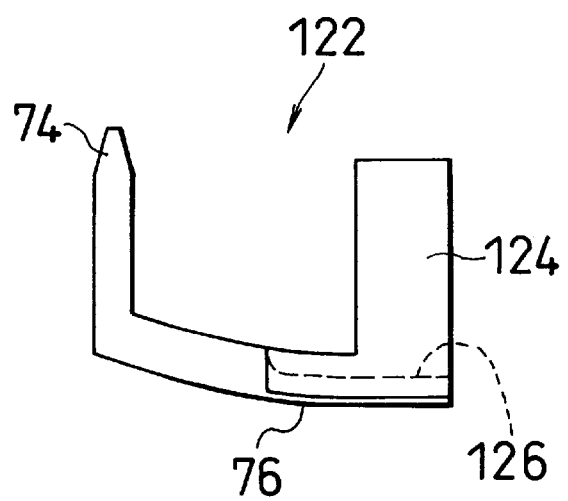
Figure 17C:
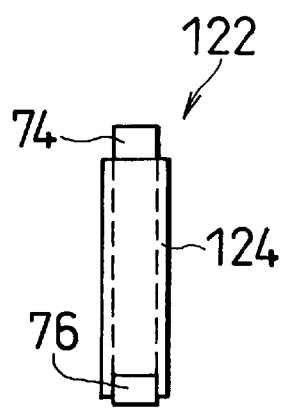

Referring to FIG. 16, a connecting apparatus 120 uses a plurality of probes 122 having such a shape as shown in FIG. 17, instead of using the probes 72 integrally extending from the tip ends to the rear ends in the connecting apparatus 70 shown in FIG. 12.

Each probe 122 is formed to have an approximately U-shape by a needle front portion 74, a deformed portion 76 and a needle tail portion 124 as shown in FIG. 17. The needle front portion 74 and the deformed portion 76 are respectively the same as those of the probe 72 shown in FIG. 12. Therefore, the needle front portion 74 and the deformed portion 76 are formed in an L-shape such that the needle front portion 74 extends linearly upward from the tip end of the deformed portion 76.

The deformed portion 76 of each probe 122 has a cutout portion 126 at its upper side for enhancing the combining force with the needle tail portion 124. The upper side (inside) portion of the rear end of the deformed portion 76 is covered with the needle tail portion 124, while the lower side (outside) is not covered with the needle tail portion 124 but is exposed.

The needle tail portion 124 is formed of a non-conductive material such as synthetic resin and extends linearly upward from the rear end of the deformed portion 76 parallel to the needle front portion 74.

The probe 122 can also be manufactured by fabrication using an electrically insulated material such as synthetic resin for the needle tail portion 124. The connecting apparatus 120 can also be utilized similarly to the connecting apparatus 10, 70 and 100 and, besides, can give actions and effects similarly to the connecting apparatus 10, 70 and 100.

Figure 18A:
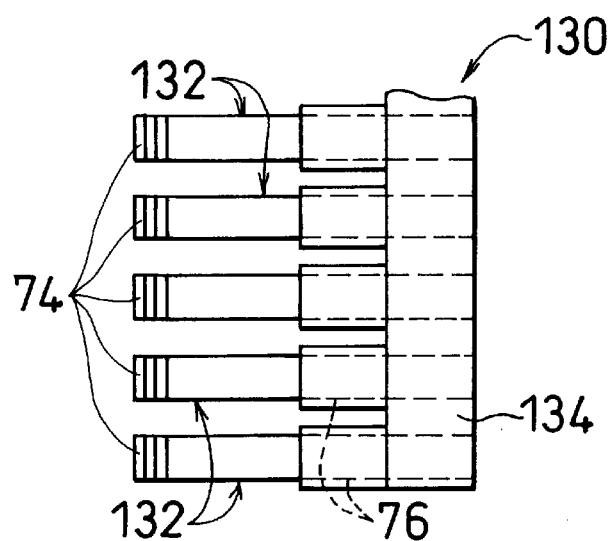
FIG. 18 are views showing another embodiment of the probe used in the connecting apparatus shown in FIG. 16, in which (A) is a plan view, (B) a front elevation, and (C) a right side view.
Figure 18B:
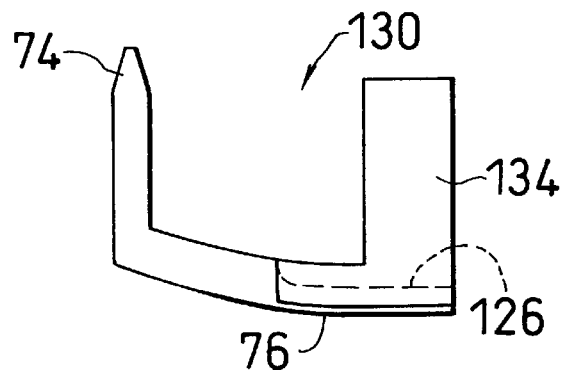
Figure 18C:
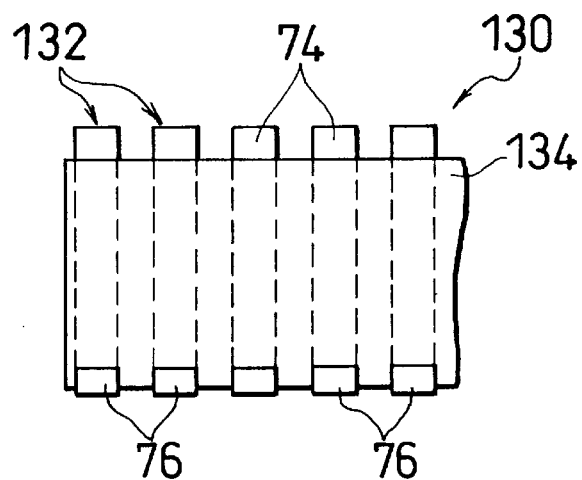

In the connecting apparatus 70 or 120, one or more needle assemblies 130 having a plurality of probes combined with the needle tail portion may be used as shown in FIG. 18, instead of using a plurality of independent probes.

Each probe 132 used in the needle assembly 130 is formed similarly to the probe 122 shown in FIG. 17 except being combined with the common needle tail portion 134 at the rear end of the deformed portion 76.

The deformed portion 76 of each probe 132 has, therefore, a cutout portion 126 at its upper side for enhancing the combining force with the common needle tail portion 134, which is made to have a comb-like shape of a non-conductive material.

The needle assembly 130 is approximately U-shaped by the needle front portions 74, the deformed portions 76 and the common needle tail portion 134 of the probes 132. The cover of the connecting apparatus using the needle assembly 130 does not have to include a wall portion 86 or 88 shown in FIG. 12.

The deformed portion 76 of each probe 132 has the cutout portion 126 at its upper side for enhancing the combining force with the needle tail portion 124. The upper side (inside) portion of the rear end of the deformed portion 76 is covered with the needle tail portion 124, while the lower side (outside) is not covered with the needle tail portion 124 but is exposed.

The connecting apparatus using the needle assembly 130 can be assembled and utilized similarly to the connecting apparatus 70 and 120, and since the needle tail portions 134 of the probes 132 are combined in common, there is such a merit as manufacturing of the needle assembly 130 as well as assembling it into the connecting apparatus are facilitated besides bringing about actions and effects similarly to the connecting apparatus 70 and 120.

In the above-mentioned embodiment, the cover is formed by a single member, but it may be formed by a plurality of members. For example, the cover may be formed by a plate-like member having the opening 38 and a member having a slot and a recess, or by a plate-like member having the opening 38, a member having a slot, and a member having a recess. Further, it may be formed by a plate-like member having the opening and a recess and a member having a slot.

Figure 19:
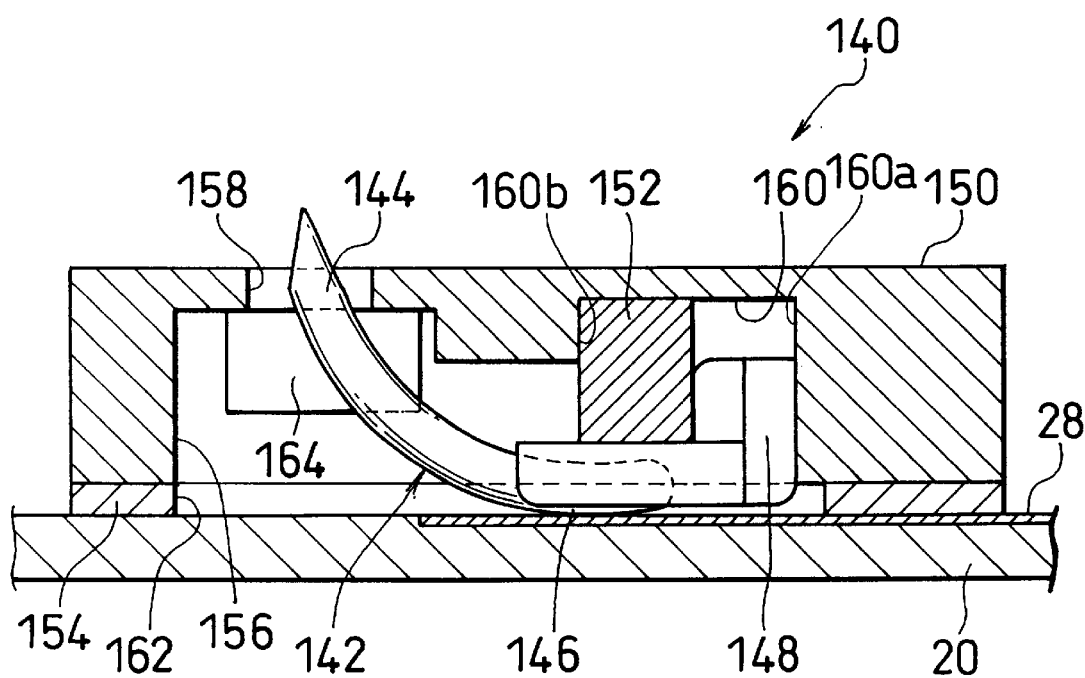
FIG. 19 is a cross-sectional view showing a part of a seventh embodiment of the connecting apparatus.

Referring to FIG. 19, the connecting apparatus 140 uses a plurality of probes 142 similar to the probe 122 shown in FIG. 17. Each probe 142 is generally curved like an arc from the needle front portion 144 to the rear end of the deformed portion 146. At least the surface of the needle front portion 144 and the deformed portion 146 of each probe 142 has conductivity.

The needle tail portion 148 is formed to be L-shaped by a non-conductive material such as synthetic resin and is fixed at the deformed portion 146. The upper side (inside) portion of the rear end of the deformed portion 146 is covered with the needle tail portion 148, while the lower side (outside) is not covered with the needle tail portion 148 but is exposed.

The needle tail portion 148 is independent in each probe 142, but may be made a common needle tail portion 148 to adjacent probes. In order to enhance the combining force between the deformed portion 146 and the needle tail portion 148, a cutout portion 126 may be formed at the upper side of the deformed portion 146 as shown in FIG. 17 or 18.

The connecting apparatus 140 has a plurality of elongated covers 150 where a plurality of probes 142 are juxtaposed, a long needle presser 152 disposed inside each cover 150 and a spacer 154.

Each cover 150 is essentially a cover base. Therefore, an auxiliary member having the opening 38 is either integrally provided on the cover 150 or assembled by screw members. Each cover 150 includes a first recess 156 opening at the side of the base plate 20, a slot 158 communicating with the first recess 156, and a second recess 160 opening at the side of the first recess 156, as one example is shown in FIG. 19. The first recess 156, the slot 158, and the second recess 160 extend continuously in the arranging direction of the probes 142.

The needle presser 152 is formed of an elastic material such as hard rubber to be rectangular in sectional shape and disposed in the first and second recesses 156 and 160. The spacer 154 includes an opening 162 of approximately the same dimension as the first recess 156, and is disposed between the cover 150 and the base plate 20 such that the first recess 156 and the opening 162 are in alignment with each other. Consequently, the spacer acts as part of the cover 150, while the opening 162 acts as part of the recess 154.

The probes 142 are juxtaposed in the first recess 156. The probes 142 are juxtaposed such that the needle front portions 144 project upward through the slot 158 and that the needle tail portions 148 extend into the second recess 160, and the rear end of the deformed portions 146 are pressed against the wiring portions 28 of the base plate 20. The probes 142 are in direct contact with the inner face 160a of the second recess 160 at the tail end face so as to be prevented from retracting.

Each cover 150 is overlapped on the base plate 20 through the spacer 154, with the probes 142 and the needle presser 152 accommodated, to be assembled into the base plate together with the spacer 154 with suitable means such as a screw member. Thereby, the probes 142, the covers 150, the needle presser 152 and the spacer 154 are made as a unit.

The connecting apparatus 140 respectively use such units. Each unit is assembled into the common base plate 20 so that the arranging direction of the needle tips of the probes 142 may coincide with the arranging direction of the electrode portion of a device to be inspected and that the needle tips of the probes of the confronting units may oppose each other. Thereby, the electrode portion of the device to be inspected is received by the needle tip of each probe 142.

In the illustrated example, the cover 150 does not include a slot for receiving the deformed portion 146 of each probe 142. Therefore, each probe 142 has a spacer 164 abutting against the adjacent probe 142 at the needle front portion 144. The spacer 164 is formed of a non-conductive material such as synthetic resin like a plate and is fixed at one side of the needle front portion 144. However, the spacer 164 and the probe 142 may be integrally formed such that the needle front portion 144 of each probe 142 penetrates the corresponding spacer 164.

In the connecting apparatus 140, when the device to be inspected is pressed against the probe 142 and the probe 142 is subjected to overdrive at its needle tip, the probe 142 is elastically deformed so as to increase the radius of curvature of the deformed portion 146 in a state of being prevented from retracting along the deformed portion 146 and presses the needle presser 152 against the inner face 160b at the opposing side to the inner face 160a of the recess 160. Thereby, the portion of the probe 142 in contact with the conductive portion 28 changes toward the needle point side. Further, the probe 142 retracts slightly relative to the conductive portion 28 due to the upward displacement of the contacting portion of the inner face 160a. This retraction, however, does not prevent the probe 142 from being elastically deformed for the same reason as in the case of the connecting apparatus 10.

While the probe 142 effectively gives a scraping action to the electrode portion of the device to be inspected and the cover 150 does not include a slot for receiving the deformed portion 146 of the probe 142, there is no fear that the adjacent probes 142 are brought into contact with each other at the needle tip side when the needle tip is pressed against the electrode portion of the device to be inspected.

The spacer 164 may be provided in the connecting apparatus using the aforementioned probes 22, 50, 52, 54, 60, 72, 102, 112, 122, and 132. Also, instead of providing the spacer 164 in each probe, a plurality of adjacent probes may be connected by a non-conductive material such as synthetic resin at a region at the needle tip side.

Figure 20:
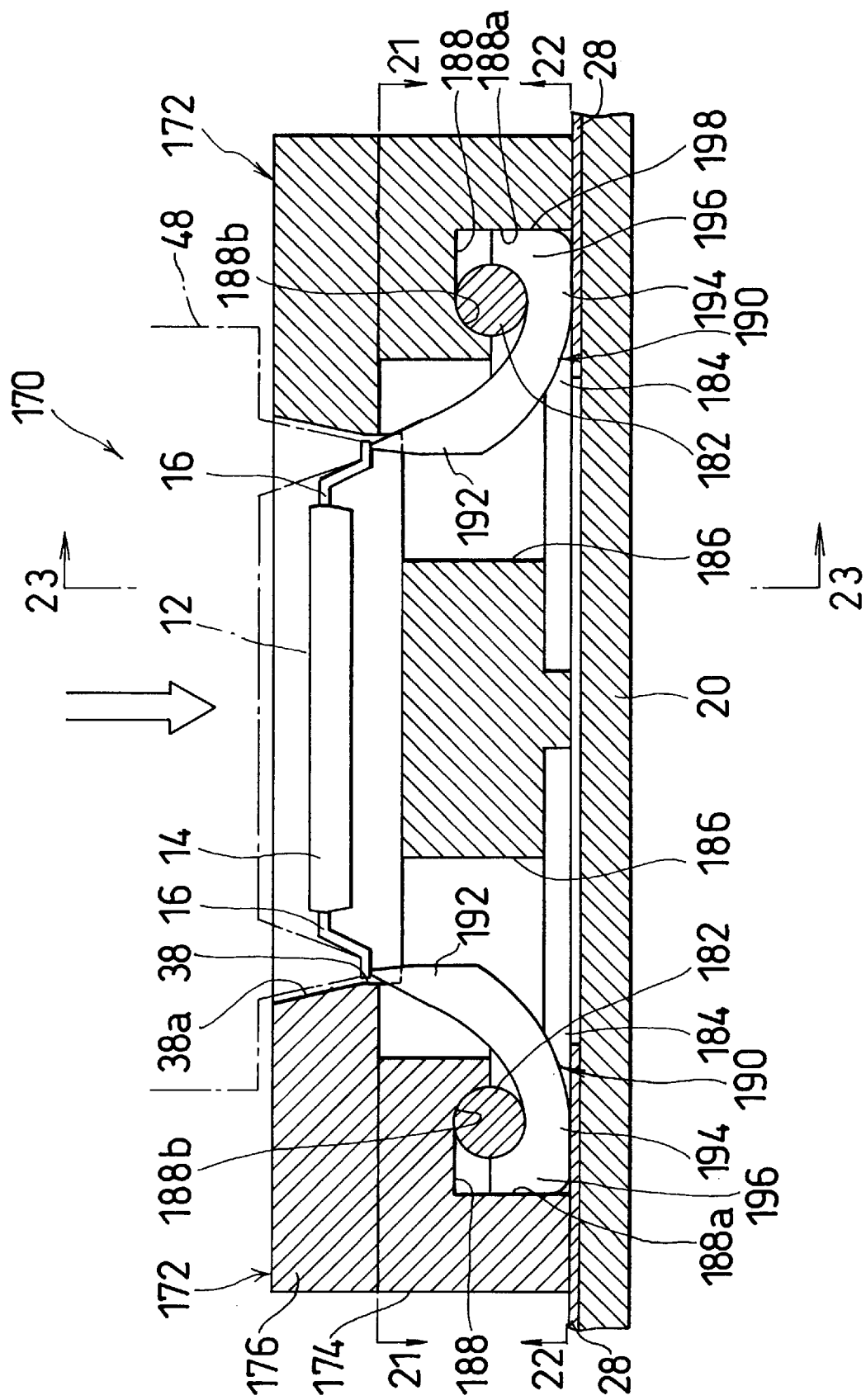
FIG. 20 is a cross-sectional view showing a part of an eighth embodiment of the connecting apparatus.
Figure 21:
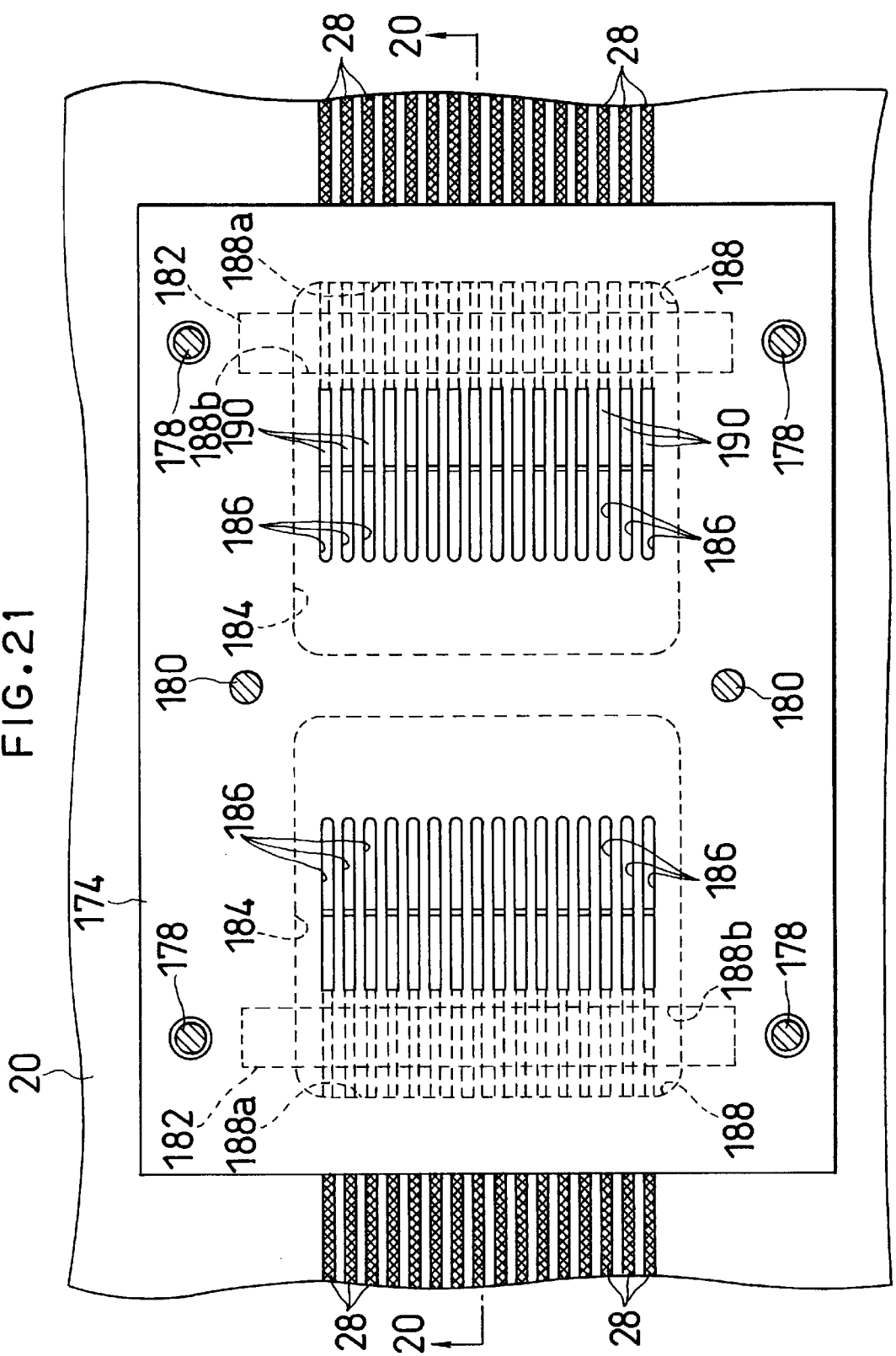
FIG. 21 is a view taken along the line 21—21 in FIG. 20.
Figure 22:
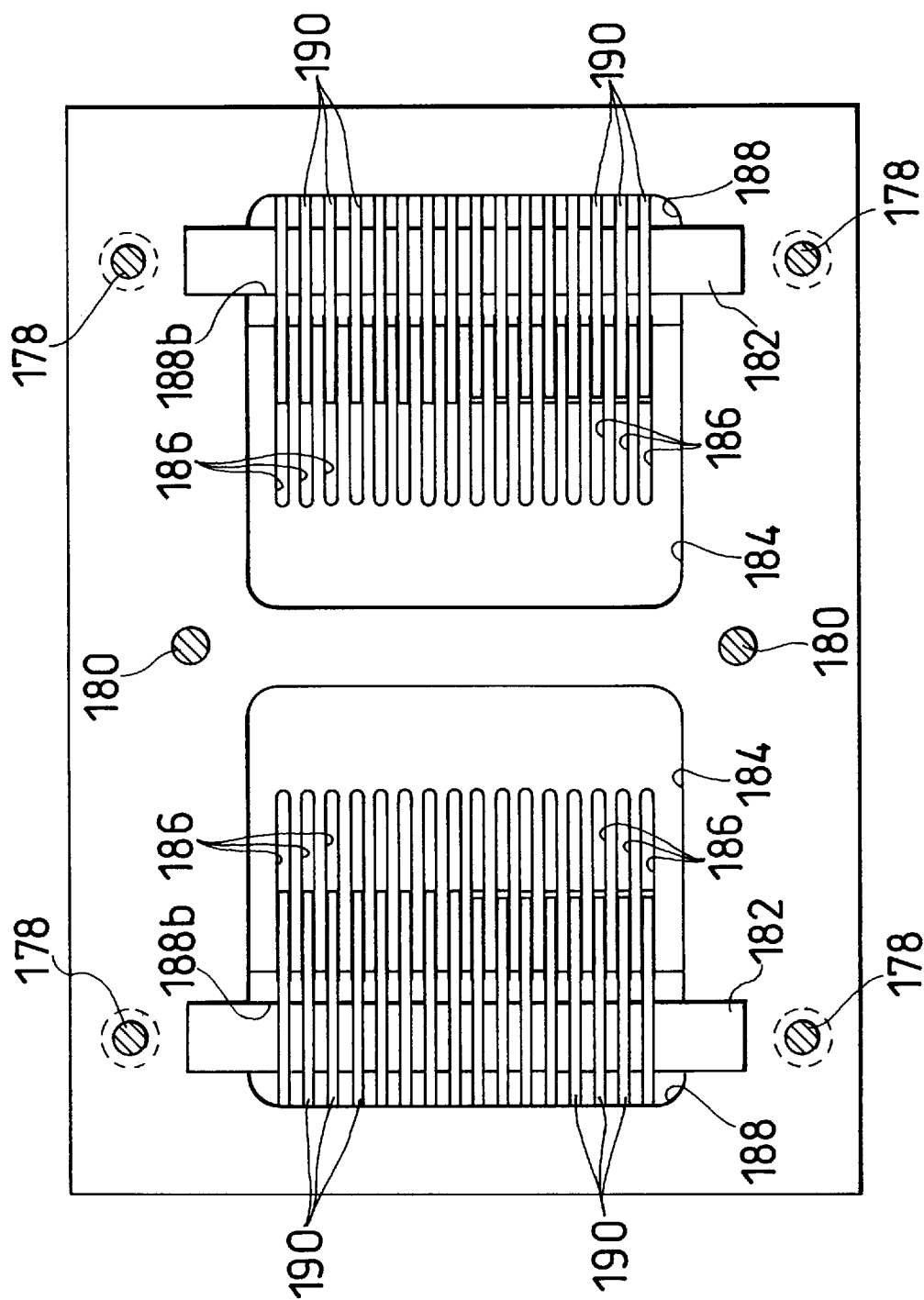
FIG. 22 is a view taken along the line 22—22 in FIG. 20.

Examples of deformation of the connecting apparatus 140 are shown in FIG. 20 through FIG. 22.

Referring to FIGS. 20 through 22, a connecting apparatus 170 uses a halved cover 172. The device 12 tested by this connecting apparatus 170 has a plurality of electrode portions 16 at both sides in the cross direction. The electrode portions 16 are divided into a plurality of electrode groups corresponding to the widthwise sides and juxtaposed in each electrode group.

A cover 172 is divided into first and second members 174, 176 as shown in FIG. 20 and are assembled into the base plate 20 in a mutually overlapped state with a plurality of screw members 178 and a plurality of positioning pins 180 (see FIGS. 21 and 22 as regards both cases).

The cover base portion, i.e., the first member 174 is integrated with the cover 150 and the spacer 154 in FIG. 19. Consequently, the first member 174 includes an opening or the first recess 184 opening at the side of the base plate 20, a plurality of slots 186 communicating with the first recess 184, and a second recess 188 where a needle presser 182 circular in sectional shape is disposed, in each electrode group. On the other hand, an auxiliary member or the second member 176 includes the opening 38 having the inclined plane 38a.

The slots 186, besides communicating with the first and second recesses 184, 188, penetrates the first member 174 in its thickness direction. The second recess 188 extends continuously in the arranging direction of a plurality of probes 190 and opens at the side of a base plate 28.

Each probe 190 is a plate-like probe (a blade-type needle) formed approximately in J-shape by a conductive metal material. The probe 190 has a needle front portion 192 with a needle tip, a deformed portion 194 integrally continuous from the rear end of the needle front portion 192, and a needle tail portion 196 integrally continuous from the rear end of the deformed portion.

The needle front portion 192 penetrates the slot 186 and projects its needle point inside the opening 18. The deformed portion 194 is curved like an arc and partially received in the first recess 184. The needle tail portion 196 has its rear end face brought into contact with the inner face 188a of the second recess 188 to be prevented from retracting.

The needle presser 182 is formed like a bar of an elastic material such as rubber in the illustrated example and extends in the longitudinal direction of the second recess 188. The needle presser 182 presses the probe 190 in a state of being assembled into the auxiliary device 170 such that the probe 190 is brought into contact with the wiring portions 28 at the deformed portion 194.

In the connecting apparatus 170, the blade-type probe 190 is used, so that when the device to be inspected is pressed against the tip end of the probe 190, the needle presser 182 is pressed against the arc-shaped inner face 188b with the needle tail portion 196. Thereby, the probe 190 is displaced so that the portion in contact with the conductive portion 28 changes toward the needle tip side.

At this time, the probe 190, pressed against the inner face 180 at the rear end by restoring force of the needle presser 182, slides slightly relative to the conductive portion 28. This slide, however, does not prevent such a displacement of the probe 190 as the portion in contact with the conductive portion 28 changes toward the needle tip side. As a result, the connecting apparatus 170 also gives an action and effect similar to the case of the connecting apparatus 140.

Figure 23:
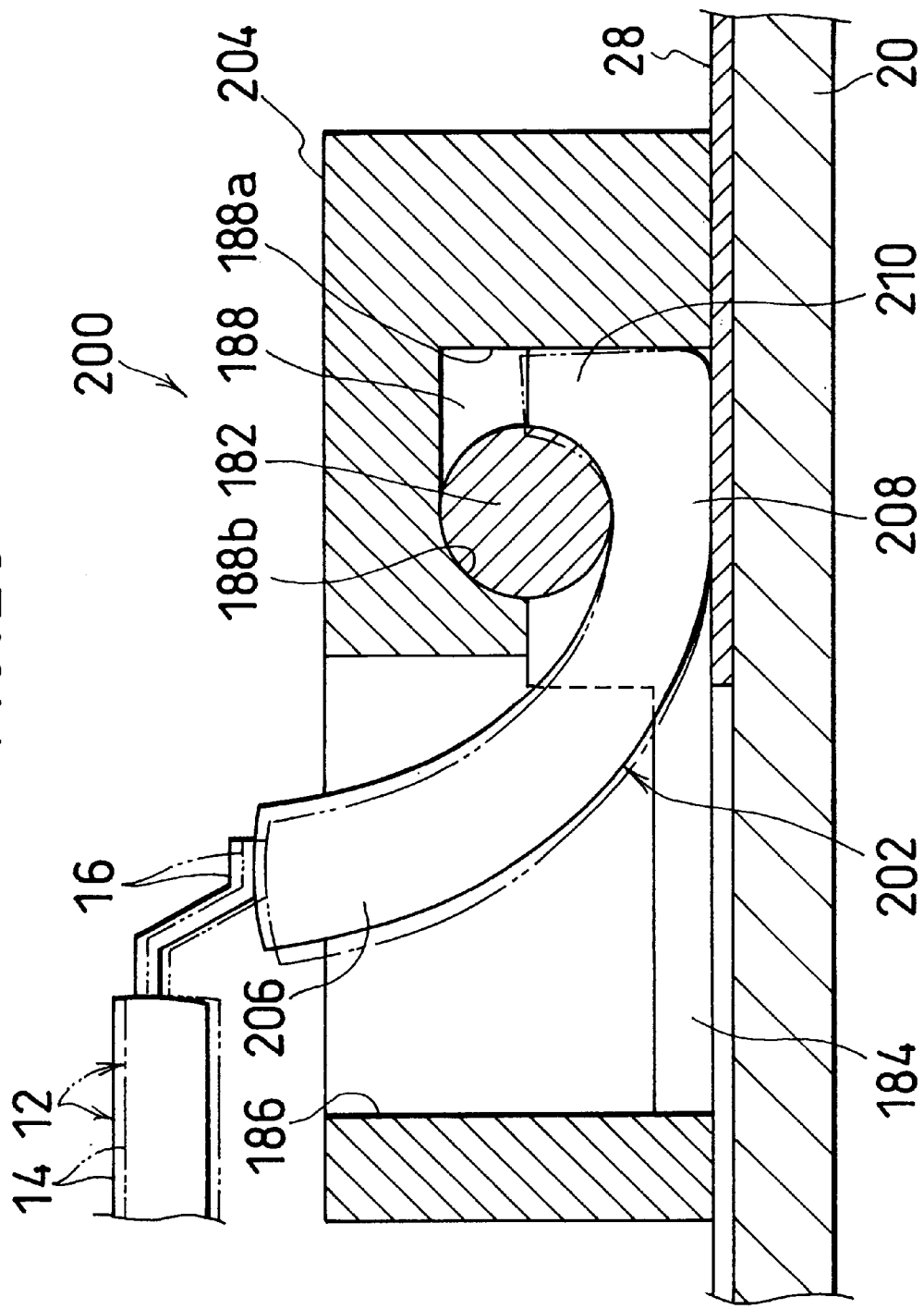
FIG. 23 is a cross-sectional view showing a part of the ninth embodiment of the auxiliary apparatus for testing.
Figure 24:
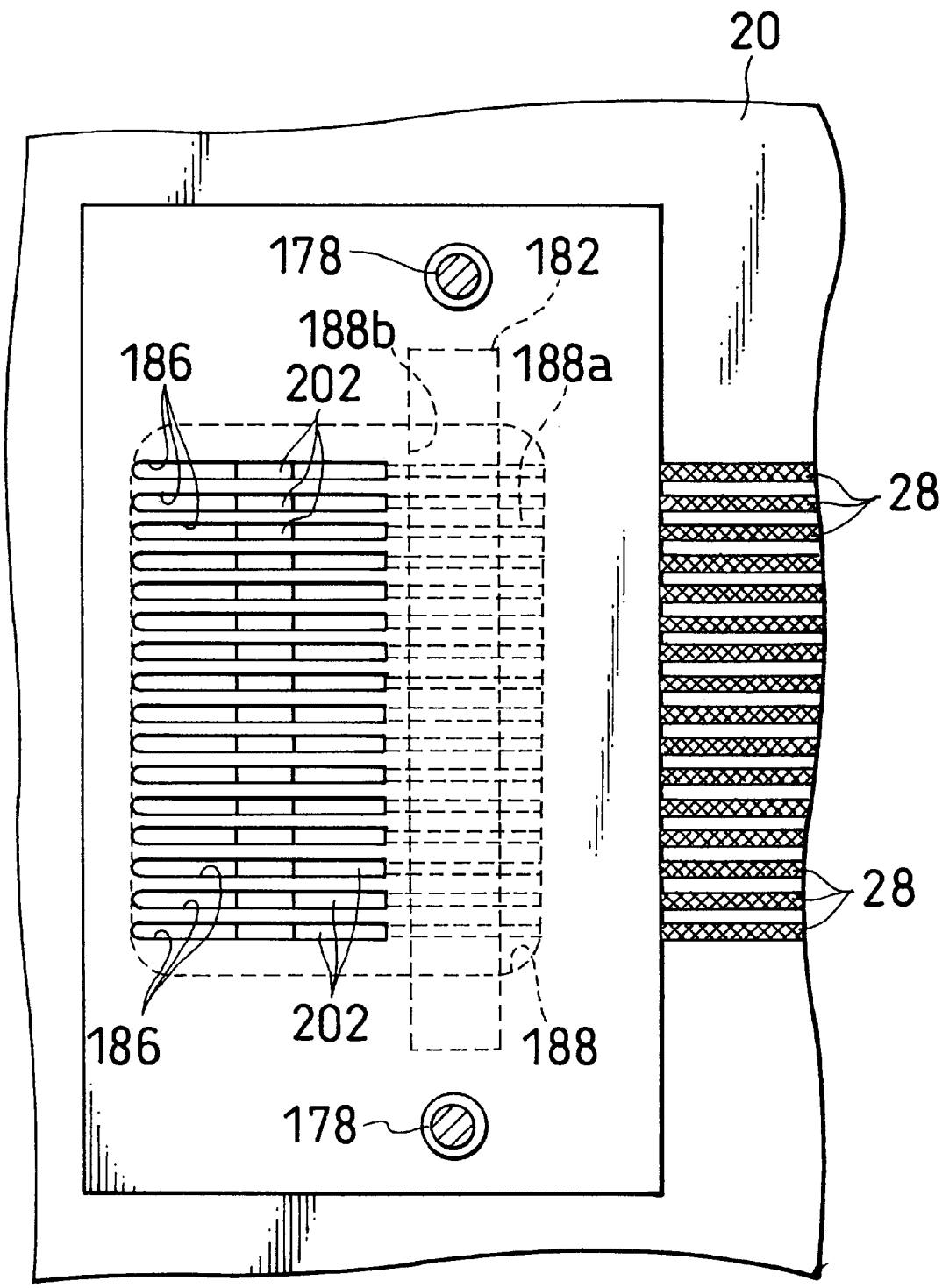
FIG. 24 is a plan view of FIG. 23.

Other examples of deformation of the connecting apparatus 140 are shown in FIGS. 23 and 24. The connecting apparatus 200 disposes a plurality of units on the common base plate, including a plurality of plate-like probes 202 formed in substantially J-like shape of a conductive metal material, a cover 204 corresponding to the region rightward from the line 23—23 in FIG. 20 in the first member 174, and the same needle presser 182 as in case of the connecting apparatus 170.

Each probe 202 is an ax-shaped needle with its needle tip extending in the longitudinal direction in FIG. 23, and a needle front portion 206 has a needle tail portion 210 in contact with an arc-shaped deformed portion 208 and an inner face 188a. The probe 202 is disposed in a cover 204 similar to the case of probe 190 of the connecting apparatus 170.

The connecting apparatus 200 also has a plurality of units assembled into the common base plate 20 as in the case of the connecting apparatus 140. Therefore, the connecting apparatus 200 also gives an action and effect similar to the case of the connecting apparatus 140, 170. In the connecting apparatus 40 or 200, a second member having the opening 38 of the connecting apparatus 170 may be disposed in common on the covers 150 or 204.

In the connecting apparatus 140, 170, 200, the first recess 156, 184 may be made a recess composed of a plurality of grooves for receiving at least a part of the deformed portion of the probes individually corresponding to the probes 142, 190. In this case, such grooves extend at intervals in parallel in the longitudinal direction of the needle presser. The first and second recesses 156 and 160 as well as 184 and 188 may be one recess. In the connecting apparatus 140, instead of making the first recess 156 a recess composed of a plurality of grooves, the opening 162 of the spacer 154 may be made such a groove.

The present invention is not limited to the above-mentioned embodiments. For example, the probes may be formed to have such simple shapes as an arc-shape, a one-side open rectangular shape, a U-shape, an L-shape, a V-shape, a W-shape, etc. Also, the probes may be used with the shapes turned upside down in the foregoing embodiments.

It will be apparent to those skilled in the art that various modifications and variations can be made in the apparatus and method of the present invention without departing from the spirit or scope of the invention. Thus, it is intended that the present invention cover the modifications and variations of this invention, provided they come within the scope of the appended claims and their equivalents.

What is claimed is:

1. A connecting apparatus adapted to be electrically connected with a device to be tested, the device having a plurality of electrode portions, the connecting apparatus comprising:

a base plate, one face of said base plate including a conductive portion formed thereon;

a plurality of probes, each electrically connecting said electrode portions and said conductive portion; and an assembling equipment for assembling said probes in parallel into said base plate, wherein each probe includes a deformed portion, a needle front portion continuous with one end of said deformed portion, said needle front portion having a needle tip to be pressed against each of the electrode portions of the device; and a needle tail portion continuous with the other end of said deformed portion, and wherein said assembling equipment is provided with a retraction preventive portion for preventing said probes from retracting, and an elastically deformable needle presser portion to be in contact with said deformed portions or said needle tail portions of said probes, and said probes bring said tail end portions into contact with said retraction preventive portion.

2. A connecting apparatus according to claim 1, wherein each of said probes has an outside region extending in an arc-like shape to contact said conductive portion when each of said electrode portions is pressed by each of the needle tips.

3. A connecting apparatus according to claim 2, wherein a portion of each of said outside regions in contact with said conductive portion is adapted to shift along the probe toward said needle tip side as said electrode portion is pressed by said needle tip with greater force.

4. A connecting apparatus according to claim 3, wherein said assembling equipment is provided with one or more covers assembled into said base plate and has a recess extending in the arranging direction of said probes and said retraction preventive portion, said recess opening at the side of said base plate, said assembling equipment being further provided with one or more needle pressers having said needle presser portion extending in the arranging direction of said probes.

5. A connecting apparatus according to claim 2, wherein said assembling equipment is provided with one or more covers assembled into said base plate and has a recess extending in the arranging direction of said probes and said retraction preventive portion, said recess opening at the side of said base plate, said assembling equipment being further provided with one or more needle pressers having said needle presser portion extending in the arranging direction of said probes.

6. A connecting apparatus according to claim 1, wherein each of said probes includes a rear end face in contact with said retraction preventive portion.

7. A connecting apparatus according to claim 1, wherein said assembling equipment is provided with one or more covers assembled into said base plate and has a recess extending in the arranging direction of said probes and said retraction preventive portion, said recess including an inner face and an opening at the side of said base plate, said assembling equipment being further provided with one or more needle pressers having said needle presser portion extending in the arranging direction of said probes.

8. A connecting apparatus according to claim 7, wherein each of said one or more covers is further provided with a plurality of slots arranged at intervals in the longitudinal direction of each of said one or more needle pressers, said plurality of slots opening at the sides of said base plate and said device to be tested communicating with said recess, and wherein the needle front portion of each probe penetrates said slot to project its needle tip out of said slot.

9. A connecting apparatus according to claim 7, wherein said retraction preventive portion includes the inner face of said recess.

10. A connecting apparatus according to claim 7, wherein each of said one or more covers is further provided with a plurality of slots opening at the side of said base plate, each of said slots including an end face and communicating with said recess and arranged at intervals in the longitudinal direction of each of said one or more needle pressers, and wherein each probe is received in said slot at a part of said deformed portion.

11. A connecting apparatus according to claim 10, wherein said retraction preventive portion includes the inner face of said recess or the end face of each of said slots.

12. A connecting apparatus according to claim 7, wherein said assembling equipment is further provided with a stopper disposed in each of said covers so as to form said retraction preventive portion.

13. A connecting apparatus comprising:

a base plate having a plurality of conductive portions on one face;

a plurality of probes for electrically connecting electrode portions of a device to be tested and said conductive portions, respectively; and an assembling equipment for assembling said probes in parallel into said base plate, wherein each probe is provided with a curved deformed portion, a needle front portion continuous with one end of said deformed portion and having a tip end to be pressed against each of the electrode portions of the device to be tested, and a needle tail portion continuous with the other end of said deformed portion, and wherein said assembling equipment includes a retraction preventive portion for preventive said probes from retracting, and an elastically deformable needle presser portion in contact with said probes so as to bring at least a part of each of said deformed portions or said needle tail portions into contact with said conductive portions, respectively, said probes bringing said tail end portions into contact with said retraction preventive portion.

* * * * *

UNITED STATES PATENT AND TRADEMARK OFFICE
CERTIFICATE OF CORRECTION

PATENT NO. : 6,019,612
DATED : February 1, 2000
INVENTOR(S) : Y. Hasegawa et al.

It is certified that error appears in the above-identified patent and that said Letters Patent is hereby corrected as shown below:

| COLUMN | LINE | ERROR |
|---|---|---|
| [54]<br>Pg. 1, Col. 1 | Title | "ELECTRICAL CONNECTING APPARATUS FOR ELECTRICALLY CONNECTING A DEVICE TO BE TESTED" should read --ELECTRICAL CONNECTING APPARATUS-- |
| 1 | 1-3 | "ELECTRICAL CONNECTING APPARATUS FOR ELECTRICALLY CONNECTING A DEVICE TO BE TESTED" should read --ELECTRICAL CONNECTING APPARATUS-- |
| [56]<br>Pg. 1, Col. 2 | Refs. Cited<br>(U.S. Patents,<br>Item 8) | "5,254,824" should read --5,254,834-- |
| 16 | 49 | "device;" should read --device,-- |

Signed and Sealed this

Eighth Day of May, 2001

Attest:

NICHOLAS P. GODICI

*Attesting Officer*    Acting Director of the United States Patent and Trademark Office